(12) United States Patent
Riza

(10) Patent No.: US 11,895,405 B2
(45) Date of Patent: Feb. 6, 2024

(54) METHOD AND SYSTEM FOR PERFORMING HIGH SPEED OPTICAL IMAGE DETECTION

(71) Applicant: UNIVERSITY COLLEGE CORK—NATIONAL UNIVERSITY OF IRELAND, CORK, Cork (IE)

(72) Inventor: Nabeel Agha Riza, Cork (IE)

(73) Assignee: University College Cork—National University of Ireland, Cork, Cork (IE)

( * ) Notice: Subject to any disclaimer, the term of this patent is extended or adjusted under 35 U.S.C. 154(b) by 221 days.

(21) Appl. No.: 17/622,506

(22) PCT Filed: Jul. 9, 2020

(86) PCT No.: PCT/EP2020/069468
§ 371 (c)(1),
(2) Date: Dec. 23, 2021

(87) PCT Pub. No.: WO2021/009017
PCT Pub. Date: Jan. 21, 2021

(65) Prior Publication Data
US 2022/0256066 A1    Aug. 11, 2022

(30) Foreign Application Priority Data
Jul. 12, 2019  (EP) .................................... 19186121

(51) Int. Cl.
H04N 23/71 (2023.01)
G02B 5/02 (2006.01)
G02B 26/08 (2006.01)
G02B 27/10 (2006.01)
G02B 27/14 (2006.01)
H03M 7/30 (2006.01)
H04N 23/741 (2023.01)

(52) U.S. Cl.
CPC .......... H04N 23/71 (2023.01); G02B 5/0205 (2013.01); G02B 26/0833 (2013.01);
(Continued)

(58) Field of Classification Search
CPC . G01S 17/89; G02B 26/0833; G02B 27/1013; G02B 27/141; G02B 5/0205;
(Continued)

(56) References Cited

U.S. PATENT DOCUMENTS 5,905,818 A    5/1999  Ni
6,975,355 B1 *  12/2005  Yang ...................... H04N 25/00
                                            348/308
(Continued)

OTHER PUBLICATIONS

PCT/EP2020/069468 International Search Report & Written Opinion (dated Oct. 14, 2020).
(Continued)

*Primary Examiner* — Antoinette T Spinks
(74) *Attorney, Agent, or Firm* — Anthony G. Smyth; Loza & Loza, LLP

(57) ABSTRACT

The present invention provides a method for performing optical image detection using a camera module comprising a Digital MicroMirror Device, a first point Photo Detector, a second point Photo Detector, a first lens and a second lens. The method comprises: mapping incident light onto an image plane of the DMD to form a light irradiance map; selecting N pixels on the DMD for time frequency coding; associating each selected pixel with a unique Walsh code time sequence; time frequency coding by the DMD the optical irradiance values of each selected pixel using a plurality of selected bits of its associated Walsh code time sequence; detecting the time frequency coded optical irradiance values of the selected pixels simultaneously at the first point Photo Detector and at the second point Photo Detector; and performing simultaneous signal processing on the time frequency coded optical irradiance values detected by the first point Photo Detector and by the second point Photo Detector to determine the light intensity of each of the selected pixels and produce an image of the incident light.

15 Claims, 11 Drawing Sheets

(52) U.S. Cl.
CPC ....... *G02B 27/1013* (2013.01); *G02B 27/141* (2013.01); *H03M 7/3062* (2013.01); *H03M 7/3066* (2013.01); *H04N 23/741* (2023.01)

(58) Field of Classification Search
CPC ............. H03M 7/3062; H03M 7/3066; H03M 7/3068; H04N 23/71; H04N 23/741; H04N 25/00
See application file for complete search history.

(56) References Cited

U.S. PATENT DOCUMENTS

| | | | |
|---|---|---|---|
| 10,944,923 B2* | 3/2021 | Brady | H04N 25/75 |
| 2017/0026633 A1* | 1/2017 | Riza | H04N 13/239 |
| 2019/0109973 A1* | 4/2019 | Riza | H04N 23/55 |
| 2019/0353887 A1* | 11/2019 | Riza | G02B 21/367 |

OTHER PUBLICATIONS

Riza et al. "The CAOS Camera—Unleashing The Power of Full Spectrum Extreme Linear Dynamic Ranging Imaging." 2018 IEEE British and Irish Conference on Optics and Photonics, London (Dec. 12-14, 2018).

Riza et al. "The CAOS Camera Platform—Ushering In A Paradigm Change In Extreme Dynamic Range Imager Design." Proceedings vol. 10117, Emerging Digital Micromirror Device Based Systems and Applications IX; 101170L. SPIE OPTO, 2017, San Francisco, California.

* cited by examiner (a)

(b)

(c)

(a)

(b)

(c)

METHOD AND SYSTEM FOR PERFORMING HIGH SPEED OPTICAL IMAGE DETECTION

BACKGROUND

Active imaging involves using a bright light source to illuminate a target of interest. Lasers are commonly used as highly directional illuminators of scenes including scenarios of extreme dynamic range (i.e., image contrast) such as in night vision (e.g., fire and rescue) or bright daylight or moonlight conditions with some dark regions (e.g., inside tunnels within a scene) and surrounding bright zones. Depending on the application and scene scattering parameters as well as eye safety concerns, lasers used vary in wavelengths covering a full spectrum from, for example, 355 nm (UV) to visible band (480-680 nm) to NIR (705-2000 nm). Under such extreme conditions of full spectrum usage and high contrast, current CMOS/CCD/FPA technology is highly limited for delivering a full spectrum, extreme dynamic range, bright target, optical imaging unit that is also cost effective.

A new camera technology called CAOS (Coded Access Optical Sensor) developed by the inventor of the present application provides for active imaging within one camera unit. The same camera unit can also operate as a passive camera with indirect target illumination such as in white light room lighting or in sun and moonlight conditions or night vision/driving conditions. The CAOS camera operates on the principles of a multiple access Radio Frequency (RF) wireless network that relies on RF coded transmission and electronic Digital Signal Processing (DSP) based data signal recovery. In the CAOS camera, the chosen multiple pixels of light (called Pixels of Interest or POI) in the scene are time-frequency coded (like RF mobile data signals) that are then extracted after photo-detection via an optical receive antenna. The RF output signal from the optical antenna next undergoes powerful electronic DSP-based decoding that gives extreme and controllable processing gain and noise reduction for high Signal-to-Noise Ratio (SNR) pixel irradiance extraction. Compared to prior-art optical cameras, CAOS's controllable SNR pixel irradiance extraction is a unique feature giving the retrieved image data true robustness. Reliable image data is critical for decision making, e.g., in automotive vision, leading to life savings. CAOS also features inherent security as POI irradiances can only be decoded if one knows the correct time-frequency codes deployed per POI in the camera. These codes can also be hopped from time-to-time within sequences of POI, adding further security to the camera imaging operations. The CAOS camera design can be optimized for numerous applications requiring its unique features including astronomical observations, biomedical microscopy, industrial machine vision, automotive vision, robotic vision, surveillance, undersea exploration, and aerospace sensor systems. The first designs of the passive mode CAOS camera have been based on the TI Digital Micro-mirror Device (DMD). The active-mode CAOS camera uses a time-frequency modulated Light Source Array (LSA) versus the passive-mode where light from the surroundings (e.g., from sunlight, moonlight, LED or laser lighting fixtures) illuminate the target or the target itself is generating light. The CAOS camera can implement imaging via multiple mode operations. Specifically, these modes that are software programmable include the Time Division Multiple Access (TDMA) mode, the Code Division Multiple Access (CDMA) mode, the CDMA-TDMA mode, the Frequency Division Multiple Access (FDMA)-TDMA mode, the Frequency Modulation (FM)-CDMA-TDMA mode, FM-TDMA mode, and the FDMA-CDMA-TDMA mode. Engagement of FDMA and CDMA modes enables simultaneous multi-pixel improved signal-to-noise ratio photo-detection while use of TDMA prevents optical point detector saturation. The use of the FDMA and FM-modes in the CAOS operations creates noise reduction and high Digital Signal Processing (DSP) gain via temporal spectrum analysis to produce extreme dynamic range pixel-specific imaging. The publication entitled "The CAOS Camera-Unleashing the Power of Full Spectrum Extreme Linear Dynamic Ranging Imaging", 2018 IEEE British and Irish conference on optics and photonics (BI-COP), IEEE, 12 Dec. 2018, pages 1 to 4 describes a CAOS camera that allows high security full spectrum extreme linear dynamic range bright target imaging, and specifically simultaneous imaging of two independent optical bands such as the visible and infrared bands.

SUMMARY OF THE INVENTION

According to a first aspect of the invention, there is provided, as set out in the appended claims, a method for performing optical image detection using a camera module comprising a Digital MicroMirror Device, DMD (DMD1), a first point Photo Detector (PD1), a second point Photo Detector (PD2), a first lens (L3) and a second lens (L2), the method comprising:

mapping incident light onto an image plane of the DMD to form a light irradiance map;

selecting N pixels on the DMD for time frequency coding;

associating each selected pixel with a unique Walsh code time sequence;

time frequency coding by the DMD the optical irradiance values of each selected pixel using a plurality of selected bits of its associated Walsh code time sequence;

wherein when a pixel is being encoded with a code sequence bit the +θ tilt state of a DMD micromirror associated with the pixel images light from the pixel onto the first point Photo Detector (PD1) by means of the first lens (L3) and the −θ tilt state of the DMD micromirror images encoded pixel light onto the second point Photo Detector (PD2) by means of the second lens (L2);

detecting the time frequency coded optical irradiance values of the selected pixels simultaneously at the first point Photo Detector and at the second point Photo Detector; and performing simultaneous signal processing on the time frequency coded optical irradiance values detected by the first point Photo Detector and by the second point Photo Detector to determine the light intensity of each of the selected pixels and produce an image of the incident light.

In one embodiment, the method further comprises adding a calibration bit to the start of the bits of the Walsh code sequence detected by the first point Photo Detector and by the second point Photo Detector for each selected pixel prior to performing signal processing.

In one embodiment, the calibration bit is a "0" bit used by the first point Photo Detector and the calibration bit used by the second point Photo Detector is a "1" bit.

In one embodiment, the camera further comprises bandpass optical filters in the paths of the first Photo Detector and the second Photo Detector.

In one embodiment, the camera module further comprises a third lens (L1) positioned in front of the DMD, the method further comprising:

mapping the incident light onto the image plane of the DMD by means of the third lens (L1).

In one embodiment, the first lens (L3), the second lens (L2) and the third lens (L1) comprise an imaging lens and wherein the first point Photo Detector (PD1) is sensitive to a first spectral band and the second point Photo Detector (PD2) is sensitive to a second spectral band such that when the incident light comprises full spectrum light an image of the incident light is produced over two spectral bands.

In one embodiment, the camera module further comprises a first dichroic beam splitter (DBS1), a second dichroic beam splitter (DBS2), a third point Photo Detector (PD3) which is sensitive to a third spectral band and a fourth point Photo Detector (PD4) which is sensitive to a fourth spectral band;

wherein the first dichroic beam splitter (DBS1) is positioned between the second lens (L2) and the second point Photo Detector (PD2) and the second dichroic beam splitter (DBS2) is positioned between the first lens (L3) and the first point Photo Detector (PD1), and wherein the first dichroic beam splitter (DBS1) separates imaged light between the second point Photo Detector (PD2) and the third point Photo Detector (PD3) and the second dichroic beam splitter (DBS2) separates imaged light between the first point Photo Detector (PD1) and the fourth point Photo Detector (PD4);

wherein the method further comprises:

detecting the time frequency coded optical irradiance values of the selected pixels simultaneously at the first point Photo Detector (PD1), the second point Photo Detector (PD2), the third point Photo Detector (PD3) and the fourth point Photo Detector (PD4);

adding a "1" calibration bit to the start of the bits of the Walsh code bit sequence detected by the third point Photo Detector (PD3) and adding a "0" calibration bit to the start of the bits of the Walsh code bit sequence detected by the fourth point Photo Detector (PD4); and performing simultaneous signal processing on the time frequency coded optical irradiance values detected by the first point Photo Detector, the second point Photo Detector, the third point Photo Detector and the fourth point Photo Detector to determine the light intensity of each of the selected pixels and produce an image of the incident light over four spectral bands.

In one embodiment, the camera module further comprises a dispersive optic (D1) positioned in front of the third lens (L1), such that when the incident light comprises multi-wavelength collimated light, the method further comprises:

spatially dispersing by the dispersive optic (D1) the incident light along one dimension into its spectral components prior to mapping onto the image plane of the DMD by means of the third lens (L1).

In one embodiment, the first lens (L3), the second lens (L2) and the third lens (L1) comprise a spherical lens and wherein the DMD is a 1-D DMD.

In one embodiment, the DMD is a 2-D DMD, and wherein the first lens (L3) and the second lens (L2) comprise a spherical lens and wherein the third lens (L1) comprises a cylindrical lens to create a spectral pattern that is wavelength dispersed along the x-direction of the DMD and spatially expanded along the y-direction of the DMD.

In one embodiment, the method further comprises:

configuring the DMD to translate in sub-micromirror distances along the x direction to create sub-pixel spatial shifts of the optical spectrum for increasing spectral resolution.

In one embodiment, the first lens (L3) and the second lens (L2) comprise an imaging lens, wherein the DMD is a 2-D DMD configured to translate in sub-micromirror distances along the x and y directions and wherein the camera module further comprises a 2-D folded spectrum optical dispersion optic (D3) positioned in front of the DMD, such that when the incident light comprises multi-wavelength collimated light, the method further comprises:

producing by the 2-D folded spectrum optical dispersion optic (D3) a 2-D folded spectrum irradiance distribution in the x-y dimensions from the incident light prior to mapping onto the image plane of the DMD.

In one embodiment, the 2-D folded spectrum optical dispersion optic (D3) is formed by cascading a dispersive optic with a small free spectral range (D2) with a dispersive optic with a large free spectral range (D1) and beamforming optics, such that the x-direction optical irradiance distribution on the DMD imaging plane covers a coarse wavelength total bandwidth range equal to the free spectral range of the dispersive optic with a large free spectral range (D1) and the y-direction optical irradiance distribution on the DMD imaging plane covers a fine wavelength total bandwidth range equal to the free spectral range of the dispersive optic with a small free spectral range (D2).

In one embodiment, the beamforming optics comprise a first cylinder lens (C1) located in the optical path before the dispersive optic with a small free spectral range (D2) and a second cylinder lens (C2) and a third cylinder lens (C3) located in the optical path after the dispersive optic with a large free spectral range (D1).

In one embodiment, the dispersive optic with a small free spectral range comprises a Virtual Phased Array (VIPA) device and the dispersive optic with a large free spectral range comprises a planar grating device.

In one embodiment, the first lens (L3) and the second lens (L2) comprise an imaging lens, wherein the DMD is configured to translate in sub-micromirror distances along the x and y directions and wherein the camera module further comprises a first tiltable mirror (M1) and a second tiltable mirror (M2), a third imaging lens (L1) between the first mirror (M1) and the second mirror (M2), and a Photo-Detector Array (PDA) sensor, the method further comprising configuring the camera such that when the second mirror (M2) is flat, incident light strikes the first mirror (M1) to be imaged onto the image plane of the DMD by means of the third lens (L1), and when the second mirror (M2) is tilted, incident light strikes the first mirror (M1) to be imaged onto the PDA sensor by means of the third lens (L1), wherein the PDA sensor is configured to provide an initial image map of the incident light for smart control of the camera.

In one embodiment, the second tiltable mirror (M2) comprises a Digital Single Lens Reflex mirror and the method further comprising:

configuring the tilt motion of the first mirror (M1) to increase the field of view (FOV) of the camera and to provide 2-D image translation on the DMD plane.

In one embodiment, the camera module further comprises a first spectral filter (F2) positioned before the second point Photo Detector (PD2) and a second spectral filter (F1) positioned before the first point Photo Detector (PD1) to enable an image of the incident light to be produced over two spectral bands.

In one embodiment, the first lens (S3), the second lens (S2) and the third lens (S4) comprise a spherical lens and wherein the DMD is a 2-D DMD, and wherein the camera module further comprises a fourth imaging lens (S1) and a Polarization Control Module (PCM1) positioned between the fourth imaging lens (S1) and the third spherical lens (S4), wherein the method further comprises:

imaging incident light using the fourth imaging lens (S1) onto the Polarization Control Module entry plane prior to mapping onto the image plane of the DMD.

In one embodiment, the Polarization Control Module (PCM1) comprises three optical devices, where the method further comprises:

translating and rotating the three optical devices to enable four Stokes parameters for each pixel in the imaged space to be produced, wherein the three optical devices comprise a linear polarizer (P1), a quarter-wave plate (QWP1) and a half-wave plate (HWP1).

In one embodiment, the method further comprises time frequency coding by the DMD the optical irradiance values of each selected pixel using all N bits of its associated N-bit Walsh code time sequence so as to perform zero time compression imaging, where N corresponds to the number of selected pixels.

In one embodiment, the method further comprises time frequency coding by the DMD the optical irradiance values of each selected pixel using the first M bits of its associated N-bit Walsh code time sequence so as to perform time compression high speed imaging, where M is a number which satisfies 2n, n being an integer and M smaller than N.

In one embodiment, the DMD is a 1-D DMD, and wherein the step of selecting N pixels on the DMD for time frequency coding comprises:

assigning each pixel on the DMD a unique number corresponding to their sequential position along the x-axis of the DMD; and selecting those pixels assigned a number between 1 and N as the N pixels.

In one embodiment, the step of associating each selected pixel with a unique Walsh code time sequence comprises:

generating a N×N Walsh matrix, wherein the rows of the matrix are numbered from top to bottom sequentially from 1 to N and each row represents a unique N-bit Walsh code time sequence;

calculating the sequency parameter S for each column of the N×N Walsh matrix;

generating a sequency ordered modified Walsh matrix by reordering the columns of the Walsh matrix from left to right in increasing order of the calculated sequency parameter S;

and associating each selected pixel with the row of the sequency ordered modified Walsh matrix of the same number as the number assigned to the pixel.

In one embodiment, the DMD is a 2D DMD, and wherein the step of selecting N pixels on the DMD for time frequency coding comprises:

forming a 2D pixel grid of N=K×J pixels from neighbouring pixels in 2D space on the DMD, the grid corresponding to the selected N pixels; and assigning each pixel in the grid a unique number between 1 and N; wherein the unique number is assigned to the pixels in the grid sequentially from left to right along each row in turn.

In one embodiment, the step of associating each selected pixel with a unique Walsh code sequence comprises:

generating a N×N bit Walsh matrix, wherein each row of the matrix represents a unique N-bit Walsh code sequence;

folding each column of the Walsh matrix into the same K×J 2D pixel grid;

calculating sequency parameters S for each grid;

generating a modified N×N bit Walsh matrix by reordering the columns of the Walsh matrix from left to right in increasing order of calculated sequency parameters S;

numbering the rows of the modified Walsh matrix from top to bottom sequentially from 1 to N; and associating each selected pixel with the row of the modified Walsh matrix of the same number as the number assigned to the pixel.

In one embodiment, the steps of calculating sequency parameters S for each grid and generating a modified Walsh matrix by reordering the columns of the Walsh matrix from left to right in increasing order of calculated sequency parameters comprise:

calculating a sequency number for each row and each column of each grid;

calculating a total sequency number S(T)=S(x)+S(y) for each column of the Walsh matrix by adding the total sum sequency S(x) for all rows to the total sum sequency S(y) for all columns of its associated grid;

calculating ΔS as the absolute value of S(x)−S(y);

generating a modified Walsh matrix by reordering the columns of the Walsh matrix from left to right in increasing order of calculated S(T) values; wherein if the calculated S(T) values match for any columns, ordering these columns in increasing order of ΔS values, and wherein if the calculated ΔS values match for any columns, ordering these columns in increasing order of sequency S.

According to another aspect of the invention there is provided a method for providing a Stokes imaging polarimeter using a camera module comprising a Spatial Light Modulator (SLM), a first point Photo Detector, a second point Photo Detector, a polarization beam splitter (PBS1), a first linear polarizer, a second linear polarizer, a first imaging lens and a Polarization Control Module (PCM);

wherein the Polarization Control Module is positioned between the first imaging lens and the SLM, and wherein the polarization beam splitter separates imaged light on the SLM between the first point PD and the second point PD;

the method comprising:

imaging incident light using the first imaging lens onto the Polarization Control Module entry plane prior to mapping the light onto an image plane of the SLM to form a light irradiance map, selecting N pixels on the SLM for time frequency coding;

associating each selected pixel with a unique Walsh code sequence;

time frequency coding by the SLM the optical irradiance values of each selected pixel using a plurality of selected bits of its associated Walsh code sequence;

wherein the camera is configured such that when a pixel is to be encoded as a "1" bit the polarization beam splitter images light from the pixel on the SLM onto the first point PD via the first linear polarizer and images no light onto the second point PD by means of the second linear polarizer, and when a pixel is to be encoded as a "0" bit the polarization beam splitter images no light onto the first point PD via the first linear polarizer and images light from the pixel on the SLM onto the second point PD via the second linear polarizer;

detecting the time frequency coded optical irradiance values of the selected pixels simultaneously at the first point PD and at the second point PD; and performing simultaneous signal processing on the time frequency coded optical irradiance values detected by the first point PD and by the second point PD.

In one embodiment, the Polarization Control Module comprises three optical devices, and wherein the method further comprises:

translating and rotating the three optical devices to enable four Stokes parameters for each pixel in the imaged space to be produced, wherein the three optical devices comprise a linear polarizer (P1), a quarter-wave plate (QWP1) and a half-wave plate (HWP1).

In one embodiment, the method further comprises time frequency coding by the SLM the optical irradiance values of each selected pixel using all N bits of its associated N-bit Walsh code sequence so as to perform zero time compression imaging, where N corresponds to the number of selected pixels.

In one embodiment, the method further comprises time frequency coding by the SLM the optical irradiance values of each selected pixel using the first M bits of its associated N-bit Walsh code sequence so as to perform time compression imaging, where M is a number which satisfies 2n, n being an integer and M is less than N.

In one embodiment, the step of selecting N pixels on the SLM for time frequency coding comprises:

assigning each pixel on the SLM a unique number corresponding to their sequential position along the x-axis of the SLM; and selecting those pixels assigned a number between 1 and N as the N pixels.

In one embodiment, the step of associating each selected pixel with a unique Walsh code sequence comprises:

generating a N×N bit Walsh matrix, wherein the rows of the matrix are numbered from top to bottom sequentially from 1 to N and each row represents a unique N-bit Walsh code sequence;

associating each selected pixel with the row of the Walsh matrix of the same number as the number assigned to the pixel.

According to another aspect of the invention, there is provided, a system for performing optical image detection using a camera module comprising a Digital MicroMirror Device, DMD (DMD1), a first point Photo Detector (PD1), a second point Photo Detector (PD2), a first lens (L3) and a second lens (L2), the system configured with one or more modules to:

map incident light onto an image plane of the DMD to form a light irradiance map;

select N pixels on the DMD for time frequency coding;

associate each selected pixel with a unique Walsh code time sequence;

time frequency code by the DMD the optical irradiance values of each selected pixel using a plurality of selected bits of its associated Walsh code time sequence;

wherein when a pixel is being encoded with a code sequence bit the +θ tilt state of a DMD micromirror associated with the pixel images light from the pixel onto the first point Photo Detector (PD1) by means of the first lens (L3) and the −θ tilt state of the DMD micromirror images encoded pixel light onto the second point Photo Detector (PD2) by means of the second lens (L2);

detect the time frequency coded optical irradiance values of the selected pixels simultaneously at the first point Photo Detector and at the second point Photo Detector; and perform simultaneous signal processing on the time frequency coded optical irradiance values detected by the first point Photo Detector and by the second point Photo Detector to determine the light intensity of each of the selected pixels and produce an image of the incident light.

According to another aspect of the invention, there is provided, a method for performing optical image detection using a camera module comprising a Digital MicroMirror Device, DMD (DMD1), a first point Photo Detector (PD1), a second point Photo Detector (PD2), a first lens (L3) and a second lens (L2), the method comprising:

mapping incident light onto an image plane of the DMD to form a light irradiance map;

selecting N pixels on the DMD for time-frequency coding;

associating each selected pixel with a unique Walsh code time sequence;

time-frequency coding by the DMD the optical irradiance values of each selected pixel using a plurality of selected bits of its associated Walsh code time sequence;

wherein when a pixel of said selected pixels is being encoded with a code sequence bit the +θ tilt state of a DMD micromirror associated with the pixel images light from the pixel onto the first point Photo Detector (PD1) by means of the first lens (L3) and the −θ tilt state of the DMD micromirror images encoded pixel light onto the second point Photo Detector (PD2) by means of the second lens (L2);

detecting the time frequency coded optical irradiance values of the selected pixels simultaneously at the first point Photo Detector and at the second point Photo Detector; and performing simultaneous signal processing on the time frequency coded optical irradiance values detected by the first point Photo Detector and by the second point Photo Detector to determine the light intensity of each of the selected pixels and produce an image of the incident light;

wherein the method further comprises:

time frequency coding by the DMD the optical irradiance values of each selected pixel using the first M bits of its associated N-bit full Walsh code time sequence so as to perform time compression higher speed imaging, where M is a number which satisfies 2n, n being an integer and M smaller than N.

BRIEF DESCRIPTION OF THE DRAWINGS

The invention will now be described, by way of example only, with reference to the accompanying drawings in which:

FIG. 1 (a) shows one embodiment of the camera of the present invention which simultaneously recovers two different optical bands while

FIG. 9 (a) shows a time compressed image of the target for a time compression factor of 0%, FIG. 9 (b) shows a time compressed image of the target for a time compression factor of 75%, FIG. 9 (c) shows a time compressed image of the target for a time compression factor of 93.75% and FIG. 9 (d) shows a time compressed image of the target for a time compression factor of 97%;

FIG. 10 (a) shows a time compressed image of the target for a time compression factor of 0%, FIG. 10 (b) shows a time compressed image of the target for a time compression factor of 90%, and FIG. 10 (c) shows a time compressed image of the target for a time compression factor of 95%; FIG. 11 (a) shows a time compressed image of the target for a time compression factor of 0%, FIG. 11 (b) shows a time compressed image of the target for a time compression factor of 90%, and FIG. 11 (c) shows a time compressed image of the target for a time compression factor of 95%.

DETAILED DESCRIPTION OF THE INVENTION

Figure 1A:
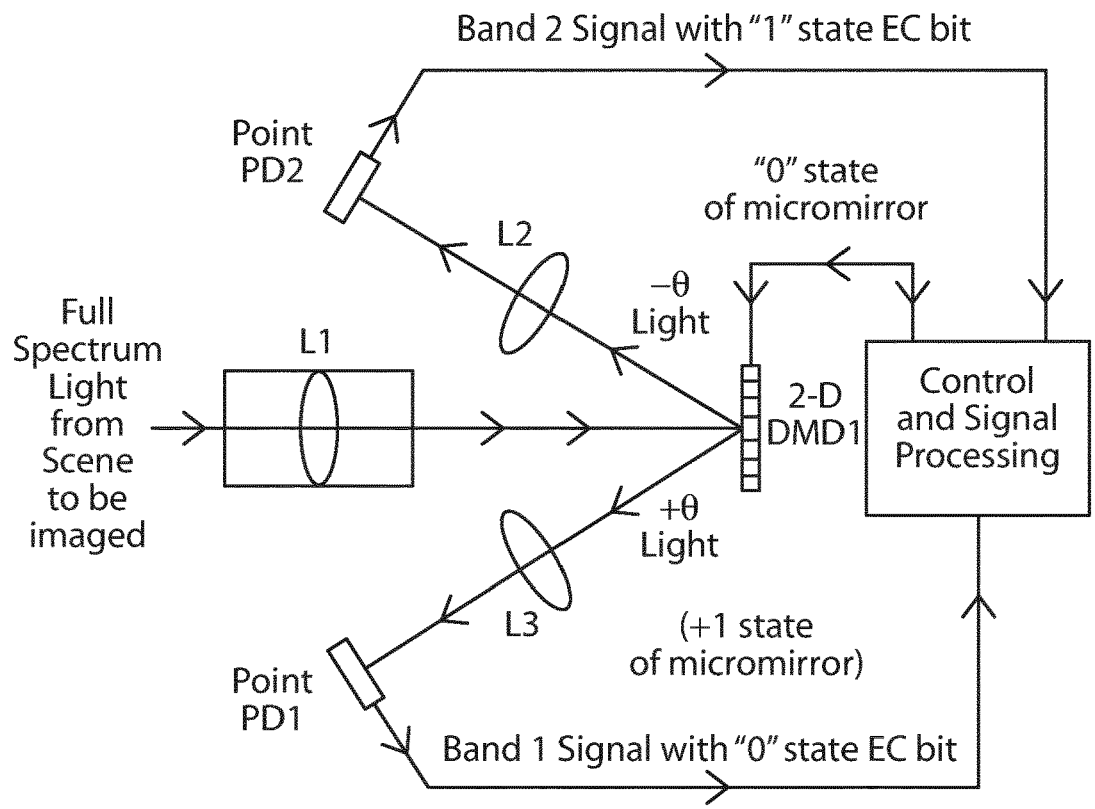

FIG. 1 shows a proposed embodiment of the design of the full spectrum extreme dynamic range CAOS camera such as for active imaging using laser illumination of targets. L1, L2, and L3 are spherical lenses used for imaging operations. L1 is an optional frontend lens that is deployed based on the type of light irradiance map requiring measurement. For example, for direct mapping of laser beam profiles, L1 is not needed. On the other hand, to map an incoherent far-field target scattering illumination light, L1 brings the far-field radiation map onto the DMD1 plane. L2 and L3 image light from the DMD1 plane onto point photodetector PD2 and point photodetector PD1, respectively. Point PD1 and point PD2 can be two different optical material detector assemblies (e.g., Silicon and Germanium) sensitive to two different spectral bands (e.g., Visible and Near IR or UV and near IR) to allow simultaneous full spectrum imaging. The broadband (350 nm to 2700 nm) 2-D DMD operates in the time-frequency CAOS mode for the chosen POI required such as for simultaneous visible and IR laser beams target tracking. Importantly, note that the DMD1 incident CAOS time-frequency modulated light goes to both point PD ports and the AC signals from these PD ports are independently and simultaneously processed via computer based DSP to extract the two different optical bands laser beam irradiance maps.

In one embodiment of the present invention, a "1" bit encoding of a CAOS pixel on the DMD for the FIG. 1 design notation means that $+\theta$ micromirror deflection light from the pixel (micromirrors) on the DMD reflects and goes to the band 1 point PD1 photo-detection unit and no light goes to point PD2. This simultaneously also means that a "0" bit encoding ($-\theta$ light state) has occurred for the same CAOS pixel on the DMD1 when using the AC signal from the band 2 point PD2 as no CAOS pixel light goes to point PD2. To demonstrate a simple example of Walsh bit sequence based encoding and decoding of a CAOS pixel in CDMA-mode, consider the example case of P=15 CAOS pixels using a N=16 bits code design with a specific jth pixel encoding time sequence (vector) $a_j^E$ of [1 0 0 1 1 0 0 1 0 1 1 0 0 1 1 0] and a jth pixel decoding time sequence (vector) $a_j^D$ of [1 -1 -1 1 1 -1 -1 1 -1 1 1 -1 -1 1 1 -1]. This encoding sequence of the jth pixel correctly shows up at spectral band 1 point PD1 for the stated FIG. 1 design and the correct band 1 pixel irradiance is recovered via autocorrelation processing using its stated $a_j^D$ decoding sequence based on 1 and -1 values (in this case, zeros in the encoding sequence are replaced by -1's in the decoding sequence) via computer processing. On the contrary, a complementary and incorrect encoding sequence of [0 1 1 0 0 1 1 0 1 0 0 1 1 0 0 1] gets detected and produced by the band 2 point PD2 and its autocorrelation processing fails to produce the band 2 light CAOS pixel irradiance.

A unique solution to this dilemma provided by the present invention is to have the band 2 point PD2 produce an AC signal that after software processing in the computer can produce the correct non-complementary encoding, i.e., specific jth pixel encoding time sequence (vector) $a_j^E$ of [1 0 0 1 1 0 0 1 0 1 1 0 0 1 1 0]. Specifically at point PD2, subtracting of a "0" bit from a "1" bit gives the correct "1" encoding bit (i.e., 1-0=1) and subtracting of a "1" bit from a "1" bit (i.e., 1-1=0) gives the correct "0" encoding bit. To determine the AC signal value of the "1" bit at point PD2 for a jth pixel to implement the software-based subtraction, an Error Correction (EC) calibration "0" value bit (for PD1 detection that is equivalently a 1 value bit at PD2) is added at the start of each DMD controlled CDMA N-bit encoding time sequence. In effect, a N+1 time bits sequence is used for encoding the P CAOS pixels where the first bit is the EC calibration bit. In the deployed example, P=15 CAOS pixels using a N=16 bits Walsh sequence and N+1=17 time bits of data acquisition for all 15 CAOS pixels in CDMA encoding where 1st bit is the added EC "0" bit for PD1 and equivalently "1" bit for PD2. For the PD1 Analog-to-Digital Converter DAC output, this EC calibrating bit AC signal data is not used for decoding and band 1 image recovery. On the contrary, the EC calibration bit used for the P CAOS pixels encoding with P different N-bit sequences produces a summed AC signal EC calibration value for all the P "1" values at PD2. Next the PD2 AC signal for each of the 16 bit sequence AC values is subtracted in software from the PD2 summed EC bit AC value (present in the first encoding time slot, i.e., the EC bit time slot), to produce the correct encoding 16 bit sequence PD2 AC levels, i.e., EC bit AC value–Encoding bit AC signal. These computed P AC signal values for the 16 time slots of the Walsh code sequence, i.e., one for each code time bit, are the correct 16 AC signal values that next undergo autocorrelation based decoding (using their matching 16 bits +1 and -1 values Walsh coding sequences) in the computer to correctly recover the PD2-based band 2 image. This simple yet powerful signal processing method using this extra initial EC bit in the encoding bit sequences for any desired P CAOS pixels on the DMD plane using CDMA binary 1 and zeros optical encoding method allows the FIG. 1 dual point PD CAOS camera to produce independent & simultaneous dual images, one for the band 2 and one for the band 1 using CDMA codes. This approach eliminates the need for time sequential image processing, e.g., first recover image band 1 data using PD1 and then recover image band 2 data using PD2 using a complementary encoding set. Hence higher (factor of 2 faster) speed CDMA-mode CAOS imaging is achieved using the FIG. 1 design engaging the EC bit technique.

Figure 1B:
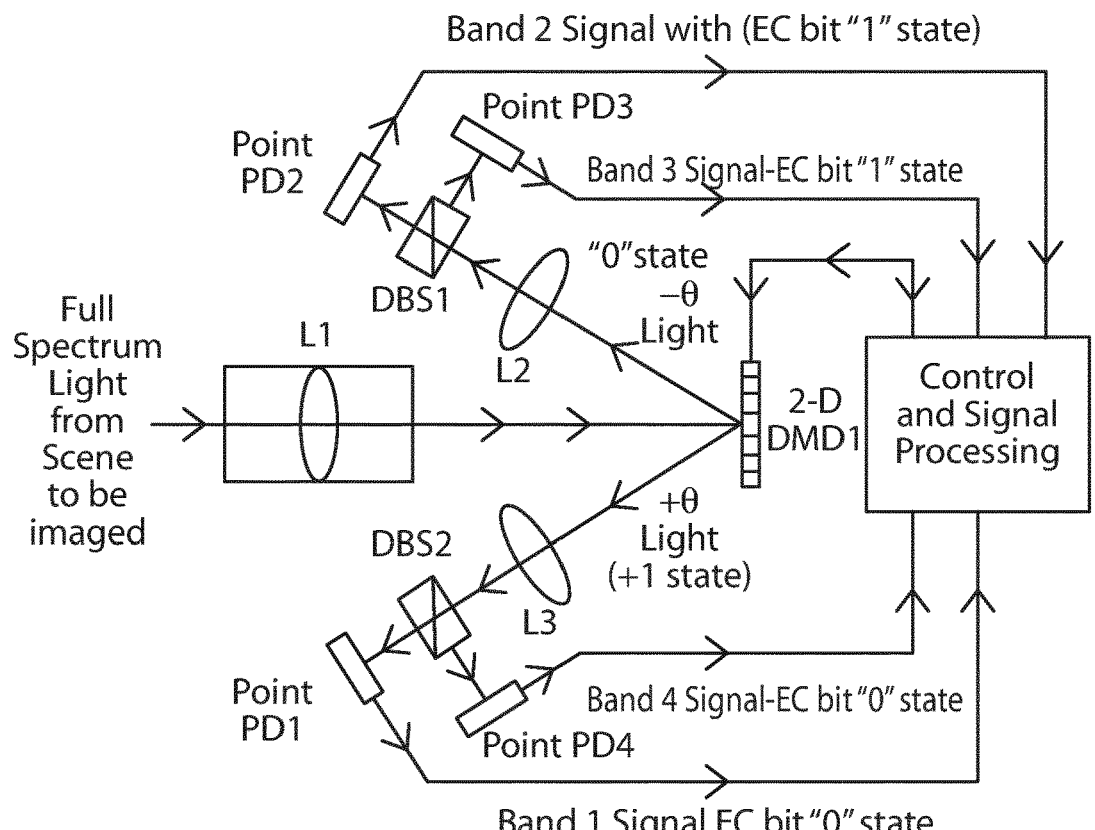
FIG. 1(b) shows an embodiment of the camera which simultaneously recovers four different optical bands.

The present invention accordingly provides POI CDMA encoding and decoding methods for simultaneous imaging of a scene in two spectral bands without the use of any independent spectral filter optics as the simultaneously operating two point PD spectral responses due to the photodetector material properties acts as the inherent optical spectral filters. To perfectly block light entering the point PDs from unwanted wavelength bands, optional bandpass optical filters can be placed in the PD1 and PD2 paths. Furthermore, more than two simultaneous bands imaging is possible if one inserts custom spectral filters in the two separate paths that the light takes after striking the DMD1. For example, as shown in FIG. 1(b) four independent bands can be simultaneously measured using two different Dichroic Beam Splitters (DBS). For example, DBS1 that separates band 2 and band 3 light can be placed in the L2 lens path with PD2 responding to the straight path through band 2 light and a new point PD called PD3 responding to band 3 light that was deflected by DBS1. Both PD2 and PD3 light have the EC-bit with a "1" state for the DMD CAOS pixels micromirrors and band 2 and band 3 irradiance data are electronically processed and decoded in the same way. In addition, DBS2 can be placed in the L1 lens path and separates band 1 and band 4 light with PD1 responding to straight through band 1 light and a new point PD called PD4 responding to band 4 light that was deflected by DBS2. Both PD1 and PD4 light have the EC-bit with a "0" state for the DMD CAOS pixels micromirrors and band 1 and band 4 irradiance data are electronically processed and decoded in the same way. Thus four spectral bands can be simultaneously imaged by the four point-PDs in the FIG. 1 (b) CAOS camera design. Additional bands or sub-bands can also be observed with the addition of the custom spectral optic components (apart from the 3 port DBS used in FIG. 1) such as gratings in planar and bulk optics that can produce spectral band light distributions in a 3-D space where custom point PDs in a 3-D conformal arrangement can sample the image data channeled to independent point detector assemblies.

In the FIG. 1 CAOS camera embodiment using the CDMA-mode, each CAOS pixel was encoded with its own Walsh code sequence, e.g., a N=16 bits time sequential Walsh code. If this code is operated optically as having "1" and "0" states for encoding, then one can at best encode and decode P=N−1=15 independent and simultaneously sampled CAOS pixels on the DMD. Walsh functions are 1-D binary state functions invented by J. L. Walsh commonly used in electronic communications. For the example discussed, these 16 bit one dimensional (1-D) Walsh (W) codes in time it turns out can also be obtained by selecting either the rows or columns of the classic Hadamard (H) matrix of size N×N or in this case 16×16. The H-matrix is a square matrix with binary states (1 and −1's) and comes from works done by Jacques Hadamard. For CDMA-mode CAOS encoding using 1's and 0's, only the all 1's code is not used, so all columns/rows of the H-matrix can be used except the first column/row containing all 1's as then the decoding fails for the all 1's code. Hence in the example design used in FIG. 1, P=N−1=16−1=15 CAOS pixels were encoded given the 1 and 0 encoding method. It is important to note that if 1 and −1 encoding is used for CAOS CDMA-mode, then we can avail of the entire N×N H-matrix for encoding and decoding for N CAOS pixels. In this case, PD1 can give the "1" state encoded signal and PD2 can simultaneously give the "−1" signal. Next these PD1 and PD2 signals (for example, as shown in FIG. 1, top camera diagram) can be electronically subtracted in hardware or software to give the desired +1 and −1 encoded CAOS signal that is then sent for decoding processing using the "+1" and "−1" values in the software processing system. Using this dual point PD data collection method in a DMD optical architecture with combined signal postprocessing for noise reduction is known. The important point to make is that any selected CAOS pixel in the DMD plane can be coded by any row or column of the H-Matrix as all these rows/columns are mutually orthogonal 1-D Walsh codes. The only condition one must not violate is that one must use all N-bits (elements) of the Walsh code (or H-Matrix column/row). This restriction also means that 100% CAOS CDMA-mode sampled image recovery of a N CAOS pixel image requires the full N-bit code in time, putting a constraint on the CAOS image encoding time. So to have faster CAOS CDMA-mode encoding time, one should reduce N, the number of encoding time bits, but this also reduces the number of CAOS pixels which is equal to N. It was mentioned earlier that one can pick any spatial location on the DMD to assign a CAOS pixel which is coded by the N-bits sequence. It turns out as explained later, if this freedom of CAOS pixel assignment is removed from the encoding method, one can still encode N CAOS pixels but this time, one can use a much smaller number of bits in time to encode each CAOS pixel, example, N=1024 CAOS pixels and use only 102 time bits for each encoding time sequence versus 1024 time bits. In effect, the CAOS encoding time is reduced by a factor of 10 as 1024/102=10.04 making the CAOS camera about ten times faster. One can also expression this imaging time reduction as a time compression (TC) factor where TC=100%×[1−{102}/1024]=90%. Next is explained how this patent application proposes a new technique that achieves this higher speed time compression based CAOS module operations while keeping a high enough CAOS pixel count with robust image data recovery.

It is well known that classic Nyquist sampling of an image means that if one spatially samples the incident image with a spatial frequency that is at least twice the spatial image bandwidth (need to do this for both x-y axes of an image), then one can completely recover the original image using the acquired samples of the image. On the other hand, when scenes are considered sparse (i.e., have mostly empty spaces—so unlike most busy natural scenes), one can under-sample the image (so one does not need to collect as many sample values as in Nyquist sampling) and still one can recover the image to a certain adequate quality rating using certain iterative algorithms for optimization. Although under-sampling of signals for adequate signal recovery has been known for a long time, this sparse sampling process is being recently called compressive sensing or compressed sensing or compressive sampling. Today many efforts have been implemented for making compressive imagers across various fields including optical wavelengths. Specifically, in known compressive imagers at optical frequencies, one must note the condition that these systems are restricted for imaging of only sparse scenes—a fundamental restriction of the nature of compressive sensing foundational mathematics and algorithms. Prior art initially has made use of pseudo-random spatial maps that have been generated and used to sample (i.e., under-sample versus Nyquist sample) the incident sparse image. Here iterative compressive sensing algorithms are used for mask generation and image estimation to reach a specific image quality criteria. More recently, other higher image compression methods for selecting the time sequential spatial masks patterns for compressive 2-D scene sampling have been used such as using machine (or deep) learning algorithms such as the Russian Dolls algorithm for selection of columns (or rows) of a Hadamard (H) matrix to construct the optimal 2-D sampling masks. Again, these fundamentally random or pseudo-random compressive sensing imaging methods are highly limited to only sparse scenes and furthermore, these implementations are restricted to highly limited imaging dynamic range given that point PDs are not coded with time-frequency signals (a feature of CAOS). It is important to note that the CAOS camera can also choose to deploy compressive sensing and other image processing methods if needed to improve operational parameters such speed for a desired CAOS pixel count while continuing to deliver high linear DR imaging.

Figure 2:
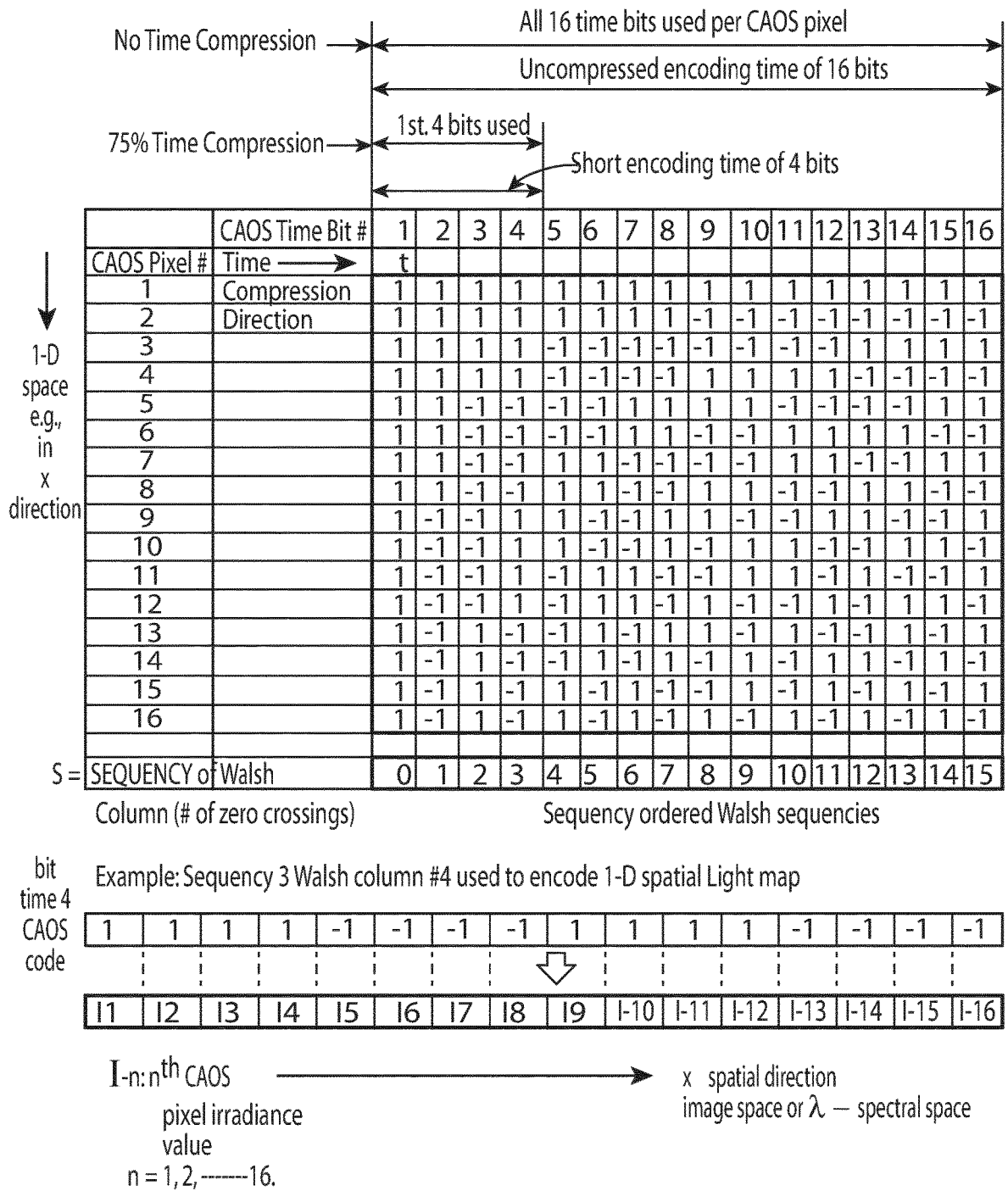
FIG. 2 illustrates a time compressive CAOS encoding method using the Walsh matrix that provides best in class time compressed CAOS operations for Line Imaging and/or Line Spectrometry.

FIG. 2 shows a time compressive CAOS encoding method using the Walsh matrix that provides best in class time compressed (or higher speed) CAOS operations for Line (i.e., 1-D spatial distribution) Imaging and/or Line Spectrometry including for Line by Line scan 2-D imaging & Spectrometry—including Polarimetry. It is known that the H-matrix is not sequency ordered, in other words, the rows or columns of the H-matrix are not ordered in increasing or decreasing sequency (e.g., placement of columns in H-matrix from left to right). If the full H-matrix is deployed for generating CAOS CDMA time codes, it does not matter if the H-matrix is not sequency ordered. Sequency S is the number of zero crossings in a column/row code sequence, e.g., for 1, 1, −1, 1, −1, the sequency is S=3. With reordering of the H-matrix from low to high sequency (left to right direction), a sequency ordered matrix is achieved and it happens to be the Walsh (W) matrix. FIG. 2 shows an example 16×16 element W-matrix where the vertical axis of the W-matrix has been labelled as the CAOS pixel number (e.g., along the x-direction of a spatial irradiance map) that varies from 1 to 16. The horizontal axis of the FIG. 2 W-matrix is labelled the time bits sequence axis that varies from time bit 1 to time bit 16. CAOS pixel 4 for example can use bits in the time sequence 1, 1, 1, 1. −1, −1, −1, −1, 1, 1, 1, 1, −1, −1, −1, −1. FIG. 2 also shows the sequency order of the W-matrix with first column of sequency zero used to make the first sampling mask on the DMD for sampling the incident irradiance map such as the shown 1-D irradiance map along a line with 16 CAOS pixels with irradiance values of I-1, I-2, I-3, I-4, I-5, . . . I-15, 1-16. As mask 1 corresponding to bit time 1 has all 1's, the point PD photo-detected signal will have a strong signal given a general natural scene that is not restricted to have sparse constraints. On the other hand, time bit 16 has alternating 1's and −1's which means that PD signal=(I-1 minus I-2)+(I-3 minus I-4)+(I-5 minus I-6)+ . . . +(I-15 minus I-16). As irradiances of neighbouring pixels subtract, e.g., I-3 minus I-4, etc, this also means that for natural scenes, given neighbouring pixels have similar light irradiance values, this I-3 minus I-4 subtracted signal and the sum of all such subtractions will be very small and as such the point PD data from mask 16 (or time bit 16) will be much smaller that the PD data from the mask 1 (or bit 1) signal. If one does the maths to write all coded CAOS pixel irradiance weighted equations for the 16 PD signal data set from the CAOS module using the DMD spatial masks, it is clear that PD data from the low sequency codes (i.e., W-Matrix column codes starting from left to right) used to make the 1-D DMD masks (like bar code style 2-D masks with optical variation along the designed CAOS pixels 1-D direction, e.g., x or horizontal direction and no optical variation along mask y or vertical direction) will have much higher PD signal weighting and hence more irradiance information for incident sampled irradiance recovery. This is because many of the point PD data equations have neighbouring pixel subtractions leading to overall smaller PD signal strengths for the PD data obtained with increasing sequency codes. In other words, lower sequency codes are given preference over higher sequency codes when picking the time bits for encoding the incident irradiance map. For example, as shown in FIG. 2, one can choose to use only the first 4 time bits in the CDMA-mode for all the 16 CAOS pixels (so each of the 4 separate DMD line masks have 16 CAOS pixels), the CAOS encoding time gets a 75% time compression (reduction) versus when all 16 time bits are used for perfect image recovery encoding. Thus one has produced a CAOS camera with an approximately 4 times faster speed with use of only 4 time bits (versus 16 time bits) while still preserving 16 CAOS pixels for irradiance sampling. The point to note with this proposed CAOS CDMA-mode encoding method is that the location of the spatially selected CAOS pixels are defined in a line with an increasing CAOS pixel number. When this condition is met, the neighbouring pixels irradiance cancelling process comes into effect allowing the exploitation of high time compression of the encoding time versus full-time bits usage in the previously proposed CDMA-mode in CAOS.

The power of the FIG. 2 time compressive CAOS encoding method becomes stronger for larger CAOS pixel counts as here a given optical irradiance zone is sampled by spatially smaller size CAOS optical pixel samplers implying that the irradiance difference between neighbouring CAOS pixels is even smaller, making the proposed FIG. 2 method even more effective in creating higher quality recovered irradiance maps with smaller percentage over the full ideal number of time bits for perfect encoding sequence. The sampled irradiance light using the FIG. 2 encoding method for CDMA-mode CAOS can be used for all irradiance distributions produced as image maps, spectral maps, and polarization content maps, etc. The technique in FIG. 2 works best with irradiance map distributions that have continuous light irradiance distributions as neighbouring pixels will have similar irradiance values. The technique in FIG. 2 also works for irradiance maps with sparse constraints, hence is a powerful overall time compressive method for CAOS without use of pseudo-random and/or random methods for encoding and decoding the CAOS pixels, fundamentally providing a sound deterministic footing for CAOS CDMA centric modes irradiance mapping operations.

An important point to note is that the Hadamard (H) matrix that is used to generate the W-matrix has some size constraints based on the algorithm used to generate it. For example in MATLAB programming environment, given N CAOS pixels using a N×N size H-matrix, the H-matrix exists only if N, N/12 or N/20 is an integer power of 2. For example, W-matrix column/row length (i.e., N) values of 64, 128, 256, 512, all meeting this H-matrix existence condition, then each CAOS pixel full time sequences code has 64, 128, 256, 512, bits, respectively. So, if one has 125 CAOS pixels in the 1-D line for irradiance recovery, one must use at least a 128 time bits Walsh code per CAOS spatial pixel. For best time compressed imaging, it is important to note that one should use codes with time bits also following a 2n length (n=1, 2, 3, etc) to get best fitting of the under-sampled optical irradiance 1-D variation. For example, if the full CAOS code is made of 256 time bits, best irradiance recovery occurs for example using code time sequence with 128, 64, 32, 16, 8 bits resulting in time compression percentages of 50, 75, 87.5, 93.75, 96.875, respectively. Visually inspecting FIG. 2 example with a 16 bits size Walsh code shows that when 50% time compression is desired, 8 time bits are used, i.e., the first 8 bits (columns) of the W-matrix from left to right columns are deployed. On expecting these 8 columns, one notes that allocated CAOS pixels 1 and 2 that are spatially adjacent have the same time codes, essentially making a new larger CAOS pixel that is the spatial sum of the two individual CAOS pixels. This behaviour is true for the CAOS pixels 3 and 4 pair, 5 and 6 pair, 7 and 8 pair, 9 and 10 pair, 11 and 12 pair, each pair have the same CDMA Walsh time code of 8 time bits. In effect, the 50% time compressed irradiance mapping forms a smooth (i.e., continuous interpolation) irradiance recovery, but by using evenly distributed double the size CAOS sampler pixels across the designed 1-D line irradiance map to collect optical light map data to fit a continuous irradiance map distribution. Thus, specific time compression percentage selections (i.e., time sequences following 2n bit numbers will produce better interpolation fits for the recovered optical irradiances varying along one direction, providing higher performance time compressed CAOS operations.

Figure 3:
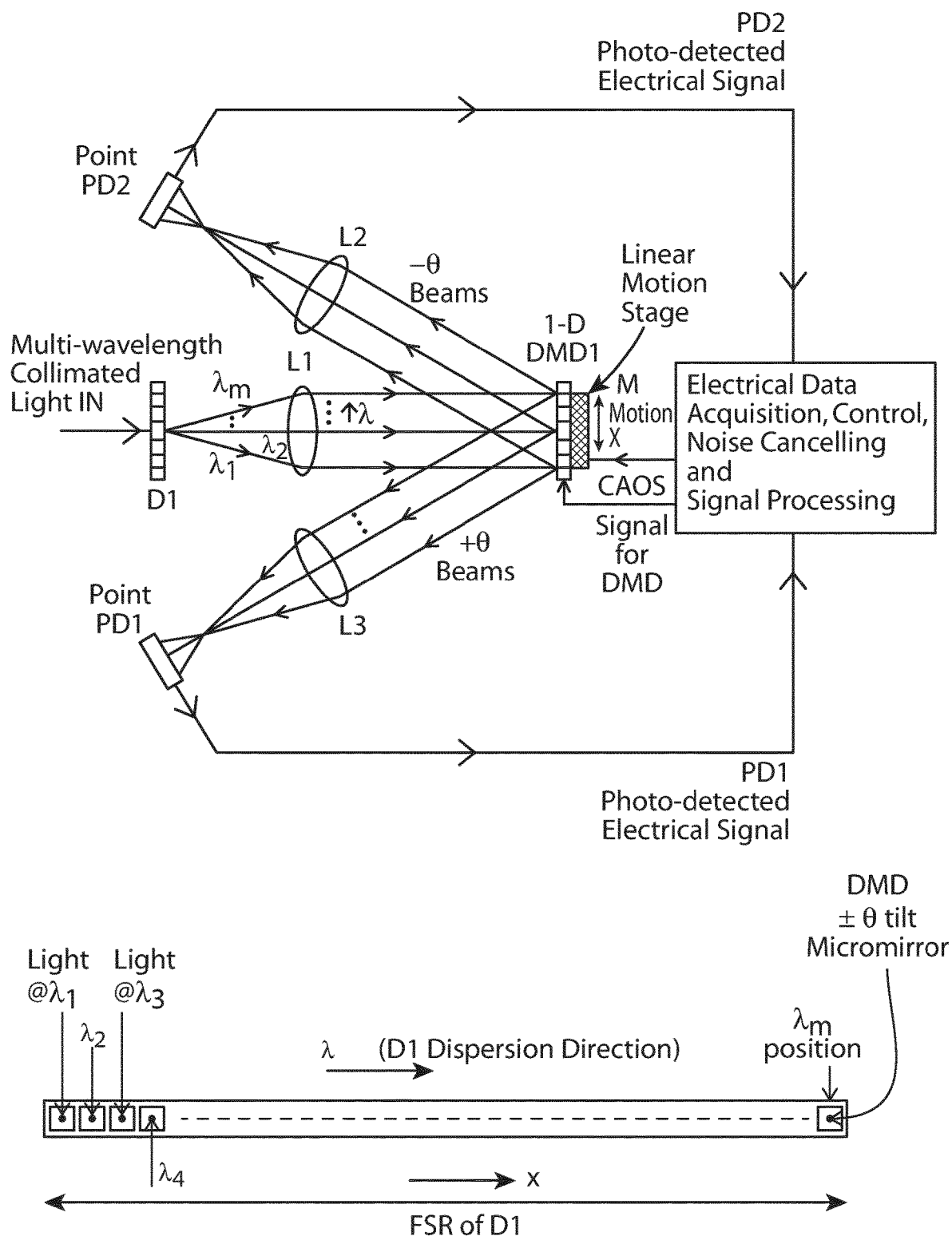
FIG. 3 shows another embodiment of the camera of the invention which implements a high speed high resolution 1-D Dispersion CAOS Spectrometer with extreme linear dynamic range.

FIG. 3 shows an embodiment of a camera of the present invention implementing high speed high resolution 1-D (i.e., 1-D spatial distribution or Line) Dispersion CAOS Spectrometer with extreme linear dynamic range. Multi-wavelength collimated light enters the FIG. 3 module and passes through a dispersive optic D1 (e.g., a planar grating optic or volume Bragg grating optic) that spatially disperses light along one dimension into its spectral components. Using the Fourier lens L1, these continuously placed spectral components form a 1-D irradiance mapping (or line) on the DMD1 plane. DMD1 can be a 1-D DMD with micromirrors arranged along the line direction. A 2-D DMD1 can also be used if spherical lens L1 is replaced by a cylindrical lens optic creating a spectral pattern that is wavelength dispersed along the x-direction of the DMD1 and spatially expanded along the y-direction (vertical) of DMD1. This 2-D spectral distribution can be used to implement for example analog-mode (or gray-scale to produce a varying sine function in time) CAOS encoding operations for implementing FM and FM-CDMA and FDMA, FDMA-TDMA modes. L2 and L3 are spherical lenses that image the DMD1 plane to the point PD2 and point PD1 planes, respectively. Compared to the FIG. 1 CAOS module that is a 2-D scene imaging module, the FIG. 3 CAOS module is an optical spectrometer that maps the 1-D line irradiance distribution spectrum of the input light. All CAOS modes (e.g., CDMA, FM-CDMA, FDMA, FDMA-CDMA, CDMA-TDMA, etc) can be used in this module including the time compressive method of FIG. 2 designed for extracting 1-D spatial irradiance maps, thus producing a higher speed CAOS spectrometer. The DMD has digital state micromirrors with inter-micro-mirror gaps. Assuming a high spectral resolution D1 optic, the CAOS spectrometer can resolve light spectra to within a micromirror size (or pitch). To resolve with a higher spectral resolution, the DMD1 can be translated sub-micromirror distances along the x or dispersion direction. With for example 10 such steps within a micromirror pitch distance, the spectral resolution can be increased by a factor of 10, assuming the spectrum is near continuous within the coarse spectral bin within a one micromirror pitch distance so interpolation techniques allow for a smooth within pixel (micromirror) fitting. Such sub-pixel micromirror shifts can lead to a CAOS spectrometer with higher spectral resolution otherwise limited by the DMD micromirror size/pitch. Movement of the DMD1 can be achieved by for example mechanical actuators/translation stages. The input dispersed light can also be translated by electro-optical, MEMS mirror optics, moving wedge/prism optics, or other means to create the sub-pixel spatial shifts of the optical spectrum. Extreme linear dynamic range spectrometry is possible with the FIG. 3 CAOS module when the FM-mode or FM-CDMA or FDMA-modes are applied to spectral extraction as here two point PD noise reduction as well as DSP and FFT processing gains allow extreme range spectral light detection, a powerful feature of the CAOS technology. Also note that the 0, 1 encoding method using just one point PD1 (as discussed in FIG. 1) and the simultaneous two bands mapping mode with 0, 1 encoding method and using the EC bit and both point PD1 and PD2 (as introduced and proposed in FIG. 1) can be used for the FIG. 3 CAOS spectrometer. Also, the FIG. 3 CAOS spectrometer design can also use the 1, −1 codes method using simultaneously both point PD1 and PD2 signal outputs subjected to software or electronic subtraction to produce the desired CAOS signals for post-processing and decoding.

Figure 4:
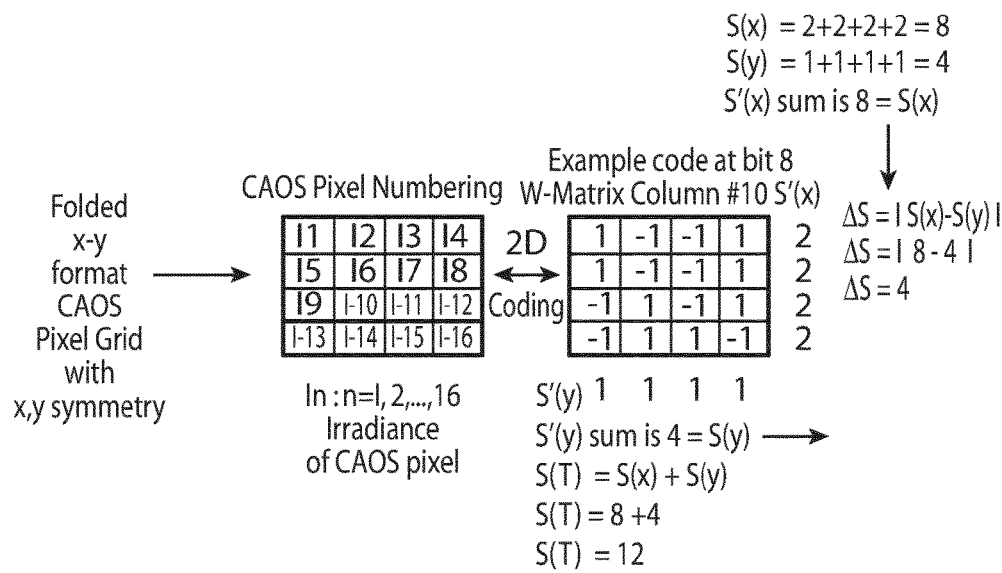
FIG. 4 illustrates a time compressive CAOS encoding method using a Modified Walsh matrix that provides best in class time compressed CAOS operations for two dimensional imaging and/or spectrometry.

FIG. 4 illustrates a time compressive CAOS encoding method using a Modified Walsh matrix that provides best in class time compressed (or higher speed) CAOS operations for two dimensional (i.e., 2-D spatial distribution) Imaging and/Spectrometry including Polarimetry. FIG. 4 design example assumes one needs to encode N=16 CAOS pixels in the CDMA mode with these pixels arranged in the folded 4×4 pixel 2-D map (see FIG. 4). The modified W-matrix that is used to sample the 2-D CAOS pixel grid is generated from the W-matrix using the proposed unique steps. First each column (or row) of the W-matrix (see FIG. 2 for 16×16 W-matrix example) is folded into its 4×4 2-D CAOS pixels grid arrangement. FIG. 4 shows the W-Matrix 10th column subjected to this folding operation of conversion from 1-D format to 2-D format. For each row and column of this 2-D folded code, a sequency number is calculated. The 2-D folded code x-direction (row) sequency is called S'(x) while the 2-D folded code y-direction (column) sequency is called S'(y). For each 2-D grid formed from a N-bits of code, a square root of N number of 2-D grid columns and rows occur. For the FIG. 4 example, N=16 which is the number of CAOS pixels so the grid is a 4×4 grid. Hence there will be 4 S'(x) values and 4 S'(y) values. The sum of the x-direction sequency values is called S(x) and the sum of the y-direction sequency values is called S(y). In the example shown in FIG. 4, S(x)=2+2+2+2=8 and S(y)=1+1+1+1=4. For each 2-D 4×4 coding grid coming from a specific column of the W-matrix (16 bits of code in the column in FIG. 4), defined is the total sum sequency called S(T)=S(x)+S(y), in this case for the 10th column of the W-matrix, S(T)=12. Furthermore, defined for each W-Matrix coding column to make the 2-D coding grid is ΔS=absolute value of S(x)−S(y). Recall from FIG. 2 that a N×N Walsh matrix is naturally ordered with the Sequency S of its columns (or rows), from left to right columns with increasing sequency S from 0, 1, 2, 3, . . . , 14, 15 for a 16×16 Walsh matrix. As proposed in FIG. 2, such a W-matrix is best for implementing time compressive CAOS for 1-D spatial irradiance map recovery with no severe constraint on image sparsity, this is unlike prior-art needing sparsity to implement compressive sensing. To derive the best in class modified N×N W-matrix to capture time compressive CAOS implemented 2-D irradiance maps versus 1-D irradiance maps where W-matrix is best in class (see FIG. 2), the following steps are followed to order the N columns of the modified W-matrix that provides the 2-D codes for time compressive 2-D CAOS. First order the modified W-matrix columns from left to right (see FIG. 4) with lowest to highest S(T) values. In the FIG. 4 shown case for 16 CAOS pixels with a 16 columns matrix, the S(T) ordering from left column to right column is as follows: 0, 4, 4, 8, 8, 8, 12, 12, 12, 12, 16, 16, 16, 20, 20, 24. Note that some S(T) values match and in this case, one needs to order these columns using the ΔS values with the columns ordered left to right with low to higher ΔS values.

For example, three modified Walsh matrix columns have S(T) values of 16. In this case one column has a ΔS values=0 and the other two have ΔS values=8. Hence the column with ΔS=0 should be placed first, i.e., to the left of the ΔS=8 columns (see FIG. 4). As in this example, it is also possible that columns with the same S(T) value also have some columns with the same ΔS value. In this case, the columns with the lower sequency S are placed first (i.e., to the left) of the higher sequency S columns. These S values are the same sequency values used to order the classic W-matrix from lowest to highest sequency values, i.e., from left to right on the time compression axis (horizontal axis of the matrix). So, in this case, the column code with S(T)=16, ΔS=8, and S=4 is placed first (to the left) of the column code with S(T)=16, ΔS=8, and S=14. One can also note in FIG. 4 that there are two columns with S(T)=20 and ΔS=4 and with S values of 11 and 13. Hence these two columns are ordered from left to right on time bit axis of modified W-matrix with first (on left) S=11 column and then S=13 column. Hence 3 steps explained earlier are followed to use the FIG. 2 W-Matrix (suited for 1-D time compressive CAOS) to derive the modified W-matrix that is used for time compressive CAOS for 2-D space mapping recovery. Again, like the FIG. 2 analysis, if one does the maths to write all coded CAOS pixel irradiance weighted equations for the 16 PD signal data set from the CAOS module using the FIG. 4 provided modified W-matrix 2-D coded DMD spatial masks, it is clear that PD data from the modified W-Matrix column codes starting from left to right on the time compression t axis) will have much higher PD signal weighting and hence more irradiance information for incident sampled 2-D 4×4 grid 16 CAOS pixels irradiance recovery. This is because many of the point PD data equations have neighbouring pixel subtractions leading to overall smaller PD signal strengths for the PD data obtained with increasing sequency codes. Compared to the FIG. 2 design, the FIG. 4 design has neighbouring CAOS pixels in 2-D, i.e., x and y axes and not just 1-D or x-axis. Again, natural 2-D scenes for imaging and most light spectrums have gradual changes in spatial and spectral irradiance values, respectively. In effect, this means that 2-D spatial maps (either image or spectral) have neighbouring CAOS pixels in 2-D space that have near similar irradiance value which means the difference in irradiances of neighbouring CAOS pixels is small and make small contributions to the point PD signal data for coding columns at positions with increasing number of time bits. In other words, the columns to the left in the modified W-matrix are given preference over the right columns when picking the time bits for encoding the incident 2-D irradiance map. As shown in FIG. 4, if time bits 1 and 2 are picked for encoding, only 2 of 16 bits (or 2-D masks) are used for CAOS encoding giving a 87.5% time compression versus using all 16 bits for mathematically perfect imaging coding and recovery. In this case, a 8 times faster CAOS camera is realized while still keeping the full 2-D CAOS pixels recovery capacity, i.e., 16 CAOS pixels from a 16×16 W-matrix for code generation. Time Compression (TC) factor=Total Number of Complete Bits in Modified W-Matrix Row/Actual Bits Used), for FIG. 4 example, TC=16/2=8. To summarize, FIG. 4 shows the process to generate the modified W-matrix as follows: Place W-matrix columns (e.g., see FIG. 2 for N=16 case) to form the modified (M) Walsh or M-Walsh encoding matrix by placing lowest sequency parameters (i.e., first consider S(T) value, then ΔS value, and then S value) columns first in the time bit sequence axis (horizontal left to right time axis shown in FIG. 4 16×16 modified W-matrix). The FIG. 4 N×N M-Walsh matrix generation approach to be used for time compressive 2-D spatial mapping CAOS applies to a N CAOS pixel mapping design for any desired time compression factor. The time compressed decoding is also done via the same N×N M-Walsh matrix components but with the chosen required fewer columns of the M-Walsh matrix. An alternate fewer steps version of the FIG. 4 generation method can also allow time compressed CAOS CDMA mode imaging where the 2nd step of using ΔS can be skipped in the generation of the modified W-Matrix. As mentioned earlier with reference to FIG. 2 and 1-D or line type irradiance mapping with irradiance variations only along 1 spatial direction (e.g., x or horizontal direction), specific time compression percentage selections (i.e., time sequences following 2n bit numbers will produce better interpolation fits for the recovered optical irradiances varying along one direction, providing higher performance time compressed CAOS operations. For FIG. 4 proposed time compressed 2-D irradiance mapping technique, this same principle applies, namely, specific time compression percentage selections (i.e., time sequences following 2n bit numbers (e.g., 256 time bits versus 255 bits given full code length of 512 bits for each CAOS pixel in 2-D image map) will produce better interpolation fits for the recovered optical irradiances varying along two directions, providing higher performance time compressed 2-D mapping CAOS operations. Described in this application is a 2-D CAOS pixel map that is a square N=K×J (where K=J) CAOS pixels map. Here encoding is done using a N×N coding full matrix with the full code time sequence length of N. Here it is important to note that the 2-D CAOS pixel map can also be a rectangular K×J map where K is not equal to J, but with chosen K and J satisfying the product K×J=N conditions that as explained earlier meet the existence requirements of the N×N H-matrix for the deployed N value. For example, N=K×J=256, and K=32 and J=8, and a N×N=256×256, the FIG. 4 technique modified W-matrix is used. For the FIG. 4 example with 16×16 Modified W-Matrix derived, one can also use J=8 (e.g., long x-direction) and K=2 (example, shorter y direction) for N=K×J=16 total CAOS pixels laid out in a rectangular x-y 8×2 grid. The 16×16 coding matrix column placements are determined using the same 3 step method shown in FIG. 4, but using the 8×2 spatial pixels grid to do the S(y), S(x), S, ΔS computations to decide the required order for the final deployed 16×16 encoding modified W-Matrix. It is relevant to point out that CAOS CDMA-mode imaging with zero time compression (i.e, use of all N-bits in the Walsh time codes) allows placement of N CAOS pixels any where in the CAOS pixels image plane. When using time compressive CAOS CDMA-mode with a finite time compression factor, all CAOS pixels must be spatially grouped in one grid, i.e., 1-D pixels arrangement grid as shown in FIG. 2 or 2-D pixels arrangement grid as shown in FIG. 4 so that pixels have neighbouring pixels. As mentioned before, best imaging results under time compression occurs with smooth and non-abrupt irradiance changes between neighbouring CAOS pixels.

The FIG. 4 method shown uses 1 and −1 value CDMA codes where for example 16 CAOS pixels in a 4×4 CAOS pixels grid are encoded using a 16×16 modified W-Matrix. In this case for the FIG. 1 CAOS 2-D imager, time compressive 2-D CAOS imaging is also possible using the FIG. 4 modified W-matrix. In this FIG. 1 design, the PD1 (representing +1 value codes) and PD2 (representing −1 value codes) signals are subtracted in software or hardware to get the required PD signal representing both 1 and −1 codes to enable time compressive decoding and 16 CAOS pixel time compressed image recovery. In other words, the FIG. 1 CAOS 2-D imaging system can also produce a higher speed operation when it engages the proposed FIG. 4 time compression method. To produce higher dynamic range performance from CAOS modules, FM modes should be introduced for the encoding to allow electronic noise reduction and Digital Signal Processing (DSP) gains, e.g., Time-Frequency Spectral Analysis such as via Fast Fourier Transform (FFT) gain advantages. Hence when engaging CDMA mode for CAOS, higher dynamic range will be produced when using FM-CDMA mode or FDMA-CDMA mode. Since FM-modes requires time oscillating bits within each CAOS code bit increasing coding time, time compressive methods help reduce the longer encoding times used for optical encoding when engaging any FM mode. In short, the proposed time compressive methods can improve the performance of FM and FDMA modes engaged CDMA coded CAOS.

Figure 5A:
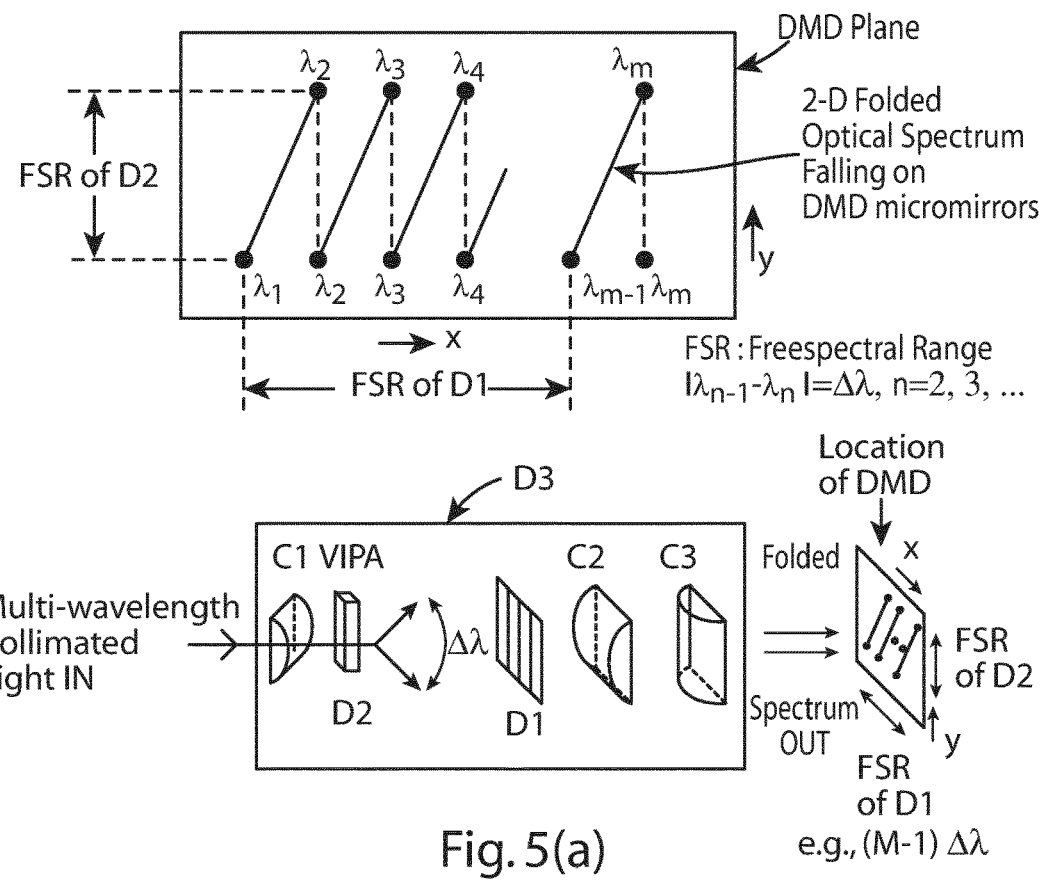
FIG. 5 shows another embodiment of the camera of the invention which implements a high speed super high spectral resolution 2-D Dispersion CAOS Spectrometer with extreme linear dynamic range.
Figure 5B:
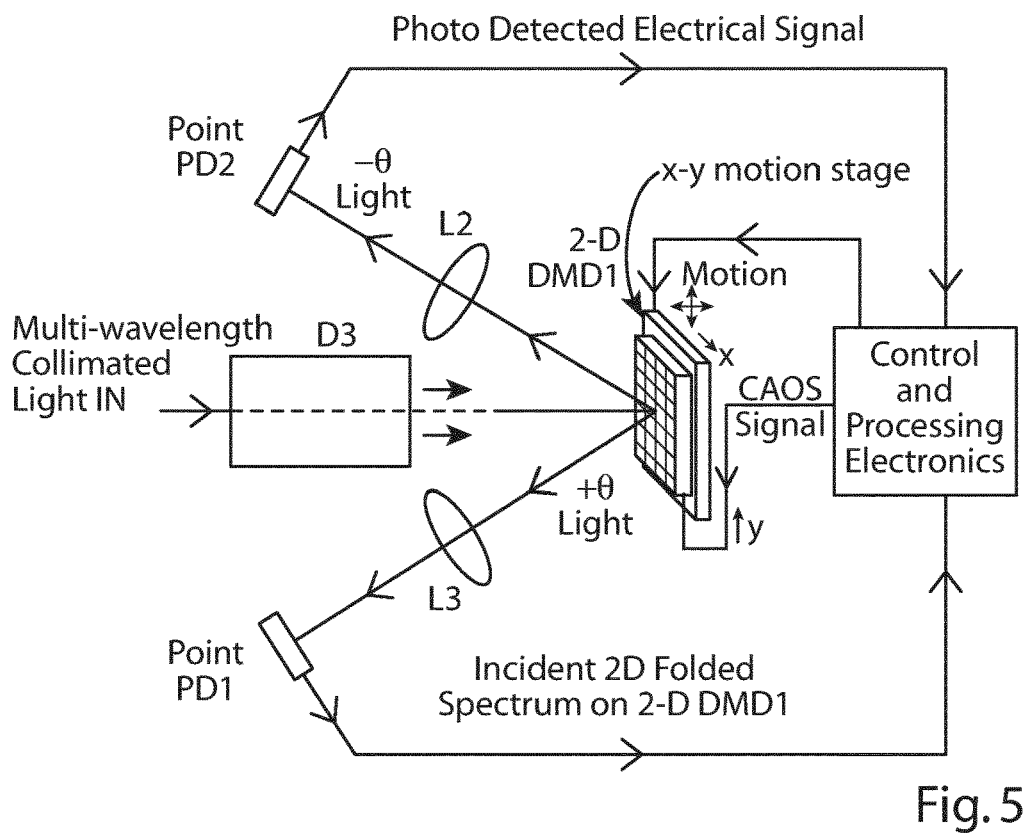

FIG. 5 shows an embodiment of a proposed high speed super high spectral resolution time compressive 2-D (i.e., 2-D spatial distribution) Dispersion CAOS Spectrometer with extreme linear dynamic range. As shown in FIG. 5, cascading a Virtual Phased Array (VIPA) device D2 with a planar grating device D1 with appropriate beamforming optics (e.g., cylindrical lenses C1, C2, and C3) can produce a 2-D folded optical spectrum distribution in the x-y dimensions. Specifically, the x-direction optical irradiance distribution covers the coarse wavelength spectral bands, each band covering a spectral bandwidth of $\Delta\lambda=\lambda p+1-\lambda p$, with p=1, 2, . . . M, over the full spectrum bandwidth of (M−1) $\Delta\lambda$ from $\lambda 1$ to $\lambda M$ of the input light into the CAOS spectrometer. The coarse wavelength total bandwidth range (M−1) $\Delta\lambda$ is equal to the Free-spectral Range (FSR) of the grating D1. The y-direction covers the fine wavelength spectral bands over the coarse spectrum resolution $\Delta\lambda=\lambda p+1-\lambda p$, with p=1, 2, . . . M. The fine wavelength total bandwidth range $\Delta\lambda$ is equal to the FSR of the grating optic D2 shown as a VIPA. The fine spectral axis along the y-direction is divided into finer spectral bins equal to the super spectral resolution provided by D2. Use the VIPA as D2 with planar grating D1 produces a slightly tilted (along y) folded spectrum as the VIPA is slightly tilted with respect to the input collimated beam. The VIPA is basically a Fabry-Perot cavity put together by placing two parallel glass plates with a small air gap in between and with highly reflective inner plate surfaces. Note that when the 2-D folded spectrum is unfolded in space, it becomes a 1-D spectral distribution from $\lambda 1$ to $\lambda M$. The bottom part of FIG. 5 shows the CAOS 2-D spectrometer design using the 2-D dispersive optic assembly D3 coupled with the two point PD 2-D DMD-based CAOS module. The 2-D folded spectrum irradiance distribution falls on the 2-D DMD1. Imaging lenses L2 and L3 map the DMD1 plane onto the point PD2 and point PD1 planes, respectively. DMD1 is placed on a x-y translation stage to implement sub-micromirror displacements to produce super resolution spectral maps using interpolation of several shifted spectral maps acquired by the CAOS spectrometer. Given that the DMD1 is illuminated with a 2-D folded spectrum irradiance distribution, the FIG. 4 encoding method using the modified W-matrix can be deployed to realize a faster speed time compressed 2-D folded spectrum CAOS spectrometer. Again, point PD1 and PD2 simultaneously generate the required +1 and −1 code signals that undergo hardware or software based subtraction to get the required +1, −1 encoded signal that enables time compressed CAOS CDMA-mode spectrometry using the FIG. 4 modified W-matrix. In addition, all other CAOS modes apply to the FIG. 5 spectrometer, especially the FM, FM-CDMA, FDMA, FDMA-TDMA modes that produce extreme linear dynamic range folded spectrum readings for the input light into the spectrometer.

Figure 6:
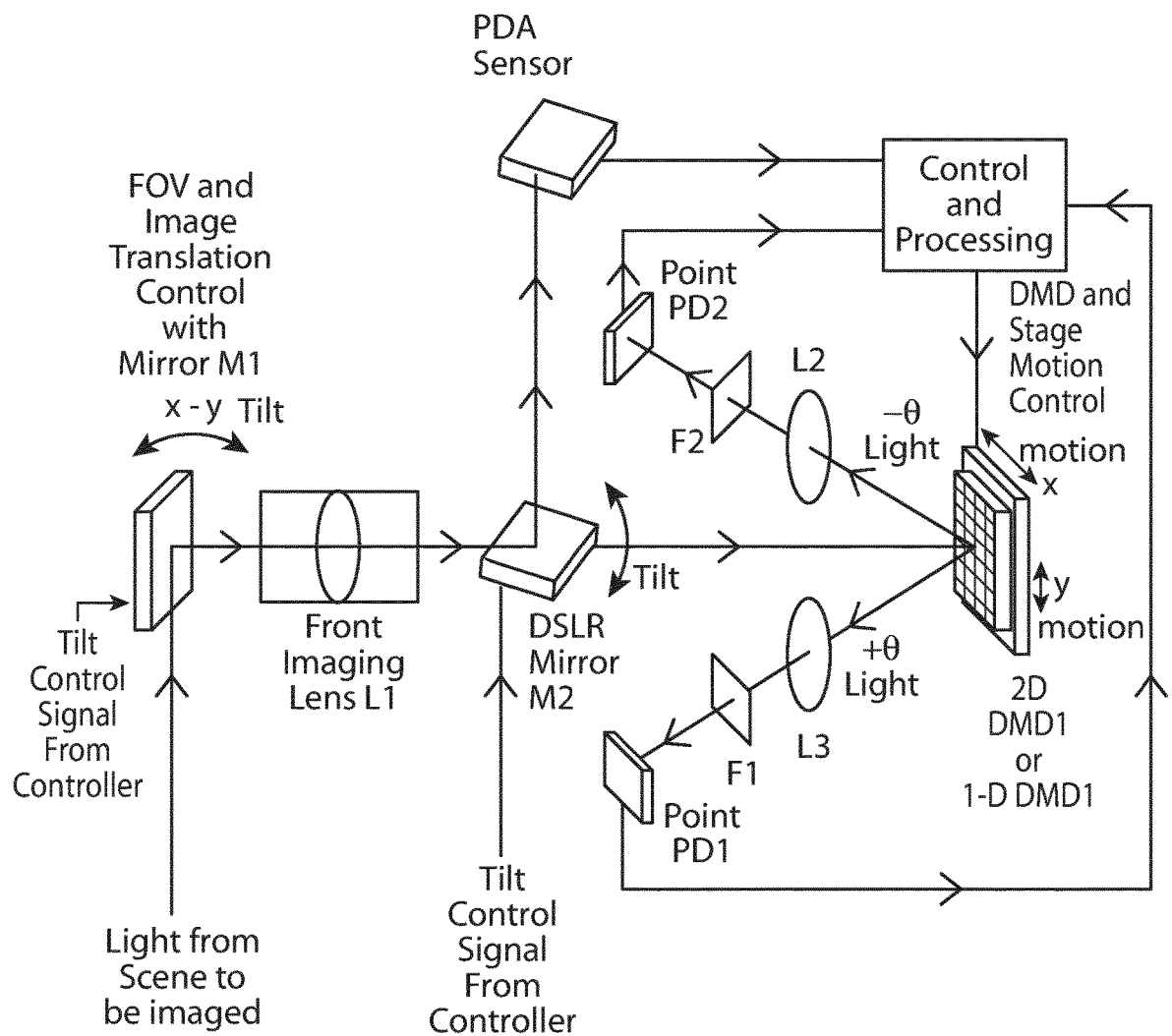
FIG. 6 shows another embodiment of the camera of the invention which implements a Wide Field of View (FOV) high speed high spatial resolution CAOS camera.

FIG. 6 shows an embodiment of a proposed Wide Field of View (FOV) high speed high spatial resolution time compressive CAOS camera with operational options of line scan 1-D imaging, line by line scan 2-D imaging, non-scan direct 2-D imaging, different 2-D zone imaging, and simultaneous dual optical spectrum bands imaging. Input scene light strikes the mirror M1 to be imaged via lens L1 onto the DMD1 plane. In this case the DSLR: Digital Single Lens Reflex mirror M2 is flat and light passes onto the DMD1. When M2 is tilted at 45 degrees, imaged light falls on the Photo-Detector Array (PDA) sensor such as a CMOS/CCD/FPA sensor chip that provides an initial image map of the input scene. This PDA provided image map data provides smart CAOS control information when extracting high contrast (and high precision) or unseen target image information using the two point PD DMD-based CAOS module. Tilt motion (x, y angular directions) of M1 is used to increase the FOV of the camera versus a static fixed FOV camera. M1 tilt motion also allows 2-D image translation on the DMD plane so different image views can be seen by the CAOS camera. In addition, 1-D tilting of M1 can move the image on the DMD1 along the y direction. In this case, a faster and cheaper 1-D DMD1 can be used instead of a 2-D DMD1 to implement a line-by-line scan 2-D CAOS imager where M1 tilting provides the shifted image lines one at a time to the 1-D DMD1 for CAOS imaging. A 2-D DMD1 can also be used for line-by-line scan imaging. In this case, software control of the 2-D DMD1 is used to apply CAOS operations on a line by line basis so at any one time, only one DMD row (line of micromirrors) are time-frequency modulated for CAOS operations. Like the FIG. 5 design, the DMD1 is mounted on a x-y translation stage that allows sub-micromirror motion to allow super spatial resolution imaging using interpolation methods using multiple sub-pixel shifted image maps. F1 and F2 are optional spectral filters that allow simultaneous imaging of two spectral bands using PD1 and PD2 and the EC bit method introduced earlier in FIG. 1. If 1-D or line style imaging is implemented, then FIG. 2 encoding method is used to realize a higher speed time compressive CAOS imager. If 2-D imaging is implemented, then FIG. 4 encoding method is used to realize a higher speed time compressive CAOS imager. Recall that FIG. 2 and FIG. 4 encoding matrices also provide the codes for the decoding operations done in the computer.

Figure 7:
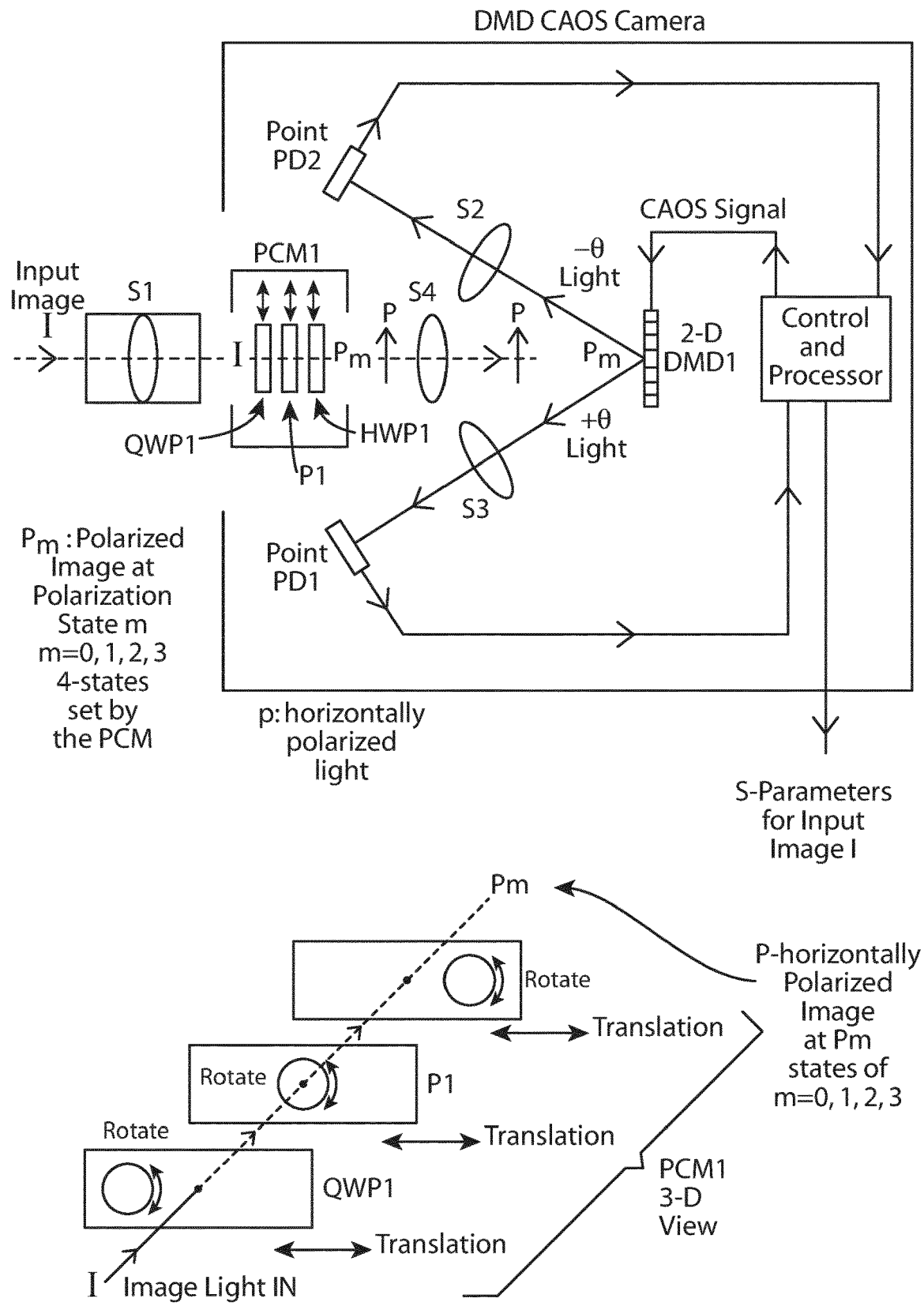
FIG. 7 shows another embodiment of the camera of the invention which implements a CAOS Stokes imaging polarimeter using a DMD.

FIG. 7 shows an embodiment of a proposed CAOS Stokes imaging polarimeter based on the DMD. State-of-Polarization (SOP) of image pixels is often needed in certain applications. It is well known that light SOP can be measured with a Stokes meter that measures the 4 Stokes or S-parameters. Placement of the correct orientation of a linear polarizer P1, Quarter-wave plate (QWP1), and Half-wave plate (HWP1) at the image plane I as shown in FIG. 7 can allow the design of a CAOS Stokes Imaging Polarimeter. Here the Polarization Control Module (PCM1) is placed between imaging lens S1 and imaging lens S4. The scene I is imaged using S1 onto the PCM1 entry I plane which in turn is imaged onto the 2-D DMD1 plane for CAOS imaging. QWP1, P1, and HWP1 can be translated in and out of the input light path. They each can also be rotated to a desired angle to produce the 4 Stokes parameters for each CAOS pixel in the imaged space. The HWP1 is used as a linear polarization rotator so p-polarized light enters S4 and the CAOS DMD module to minimize changing input polarization DMD reflection effects towards PD1 and PD2. Again, given the 2-D imaging operation, the FIG. 4 encoding method can be used to realize a higher speed time compressive 2-D CAOS Stokes imaging polarimeter.

Figure 8:
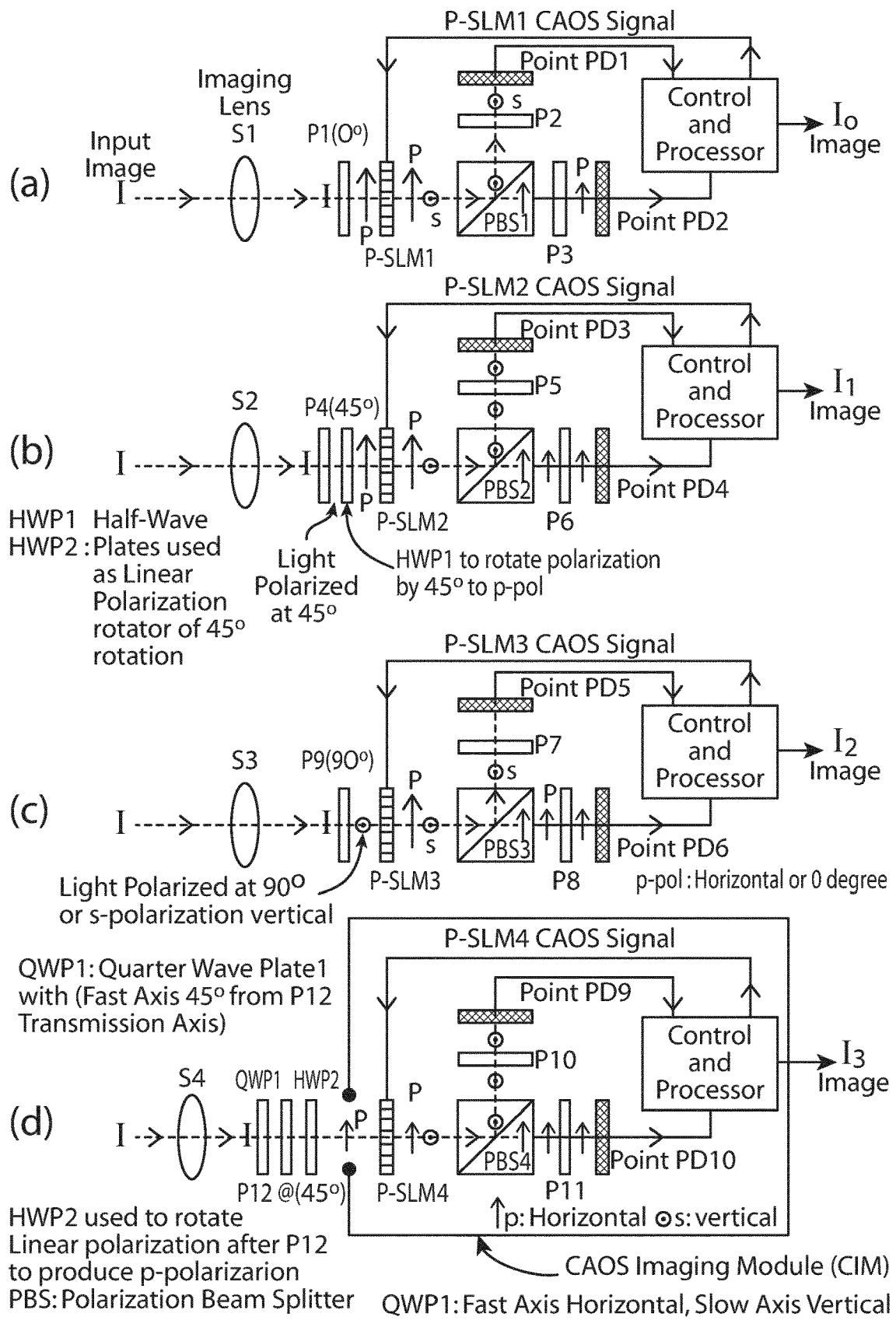
FIG. 8 shows an alternative embodiment of the camera of the invention which implements a CAOS Stokes imaging polarimeter using a Spatial Light Modulator (SLM)

It is also possible to use a polarization based SLMs to form a 2-D CAOS Stokes imaging polarimeter, as shown in FIG. 8. Here the SLM can be a liquid crystal SLM or magneto-optic SLM. For clarity, shown are 4 different PCM arrangements for a polarization based SLM 2-D CAOS Stokes imaging polarimeter that provides the 4 Stokes parameters to produce the full SOP CAOS pixels image map. Fundamentally, one PCM is placed in front of the SLM that with the Polarization Beam Splitter PBS, a pair of polarizers, and two point PDs forms the CAOS imaging module. Again, given the 2-D imaging operation, the FIG. 4 encoding method can be used to realize a higher speed time compressive polarization SLM-based 2-D CAOS Stokes imaging polarimeter. In this case, the assumption is that the SOP of neighbouring pixels in a 2-D image map have a closely similar SOPs. The FIG. 2 encoding approach can also be applied given the scene type and its SOP properties.

Figure 9:
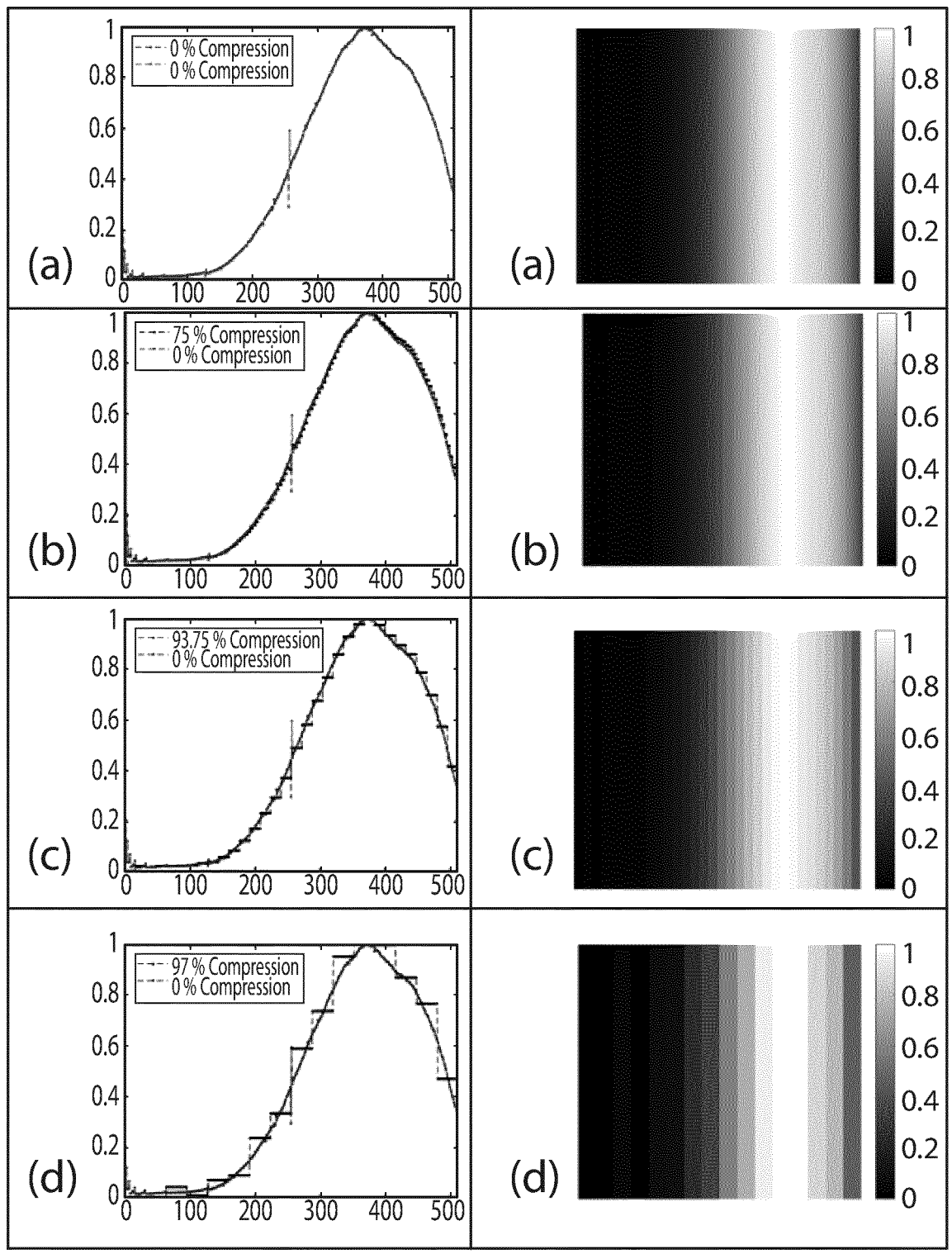
FIG. 9 shows experimental results of the FIG. 2 method of time compressive imaging suited for 1-D variation target.

Basic experimental verifications for the FIG. 2 and FIG. 4 time compression CAOS methods are described next. Using the FIG. 1 CAOS module design, but with both point PDs operating simultaneously for a single white light imaging band and CAOS CDMA encoding implemented using the proposed FIG. 2 time compressive CAOS imaging method using both +1 and −1 value Walsh codes where PD1 gives the +1 codes and PD2 gives the −1 codes, time compressive 1-D irradiance distribution recovery is experimentally achieved for a gray-scale 1-D spatial variation target. Specifically, this 2-D bar style rectangular target has optical irradiance varying only in the 1-D or horizontal direction with the variation much is smooth and showing a hill-like variation shown in FIG. 9(a) where CAOS CDMA imaging is implemented for a 1×512 CAOS pixels grid (one pixel along vertical direction and 512 pixels along horizontal direction). With MN=512 pixels, one requires 512 time bits Walsh code. Hence a FIG. 2 W-Matrix is designed using a 512×512 H-matrix. FIG. 9(a) shows the zero time compression 1-D style image of the CAOS captured target, indeed showing the hill style irradiance variation along the horizontal direction of the image. Next, time compressed CAOS images of the target are shown in FIG. 9(b), (c), (d) for time compression factors of 75%, 93.75%, 97%, respectively. The experiment verifies that the proposed FIG. 2 approach for time compressive CAOS 1-D irradiance mapping works as in all cases, the hill-like 1-D irradiance variation is recovered in the experiment. For ideal non-time compressed case for target recovery, 512 time bits are used (FIG. 9a) while for faster time compressed irradiance recovery with 75%, 93.75%, 97%, time compression factors, used are time bits of 128, 32, and 15, respectively. The case of FIG. 9(d) gives a 512/15=34.13 times faster CAOS CDMA imaging than the ideal FIG. 9(a) imaging using the full 512 time bits Walsh codes. The data shown in the left column of FIG. 9 are line trace plots of the acquired right column CAOS image data showing the irradiance variation of the captured target for zero time compression to 97% time compression. The red trace data is zero compression data while blue trace data is CAOS imaging with compression.

Figure 10:
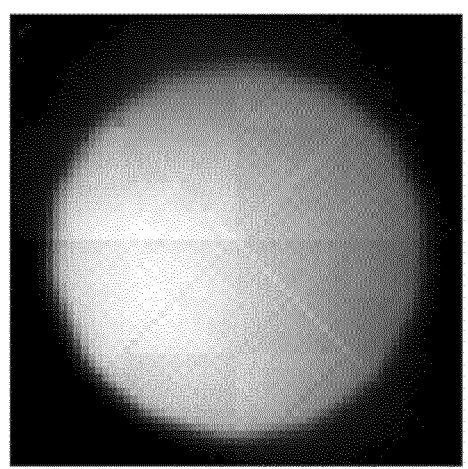
FIG. 10 shows experimental results of the FIG. 4 method of time compressive imaging suited for 2-D irradiance variation target.
Figure 10:
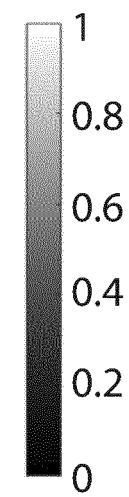
Figure 10:
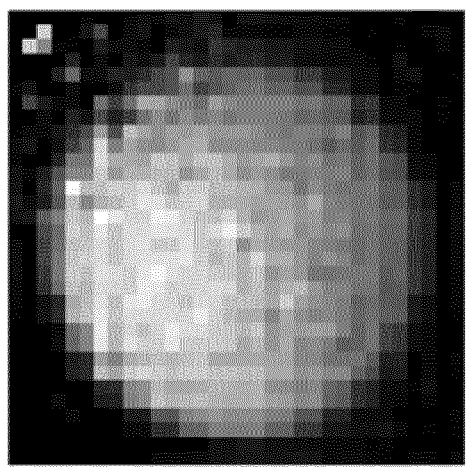
Figure 10:
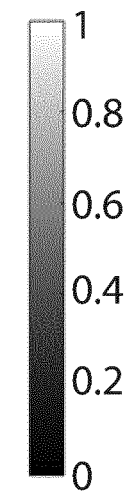
Figure 10:
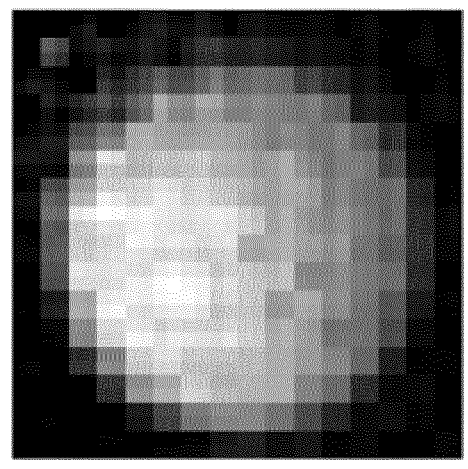
Figure 10:
Figure 11:
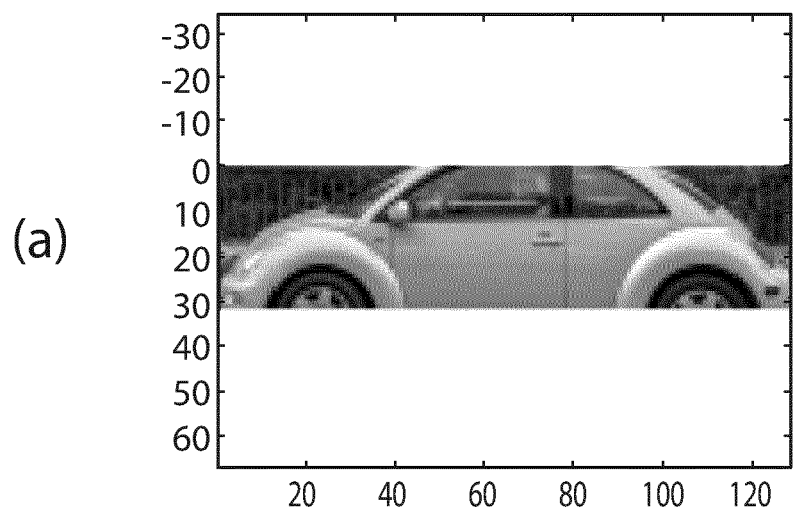
FIG. 11 shows computer simulation test results of the FIG. 4 method of time compressive imaging suited for 2-D irradiance variation for a complex contours target.
Figure 11:
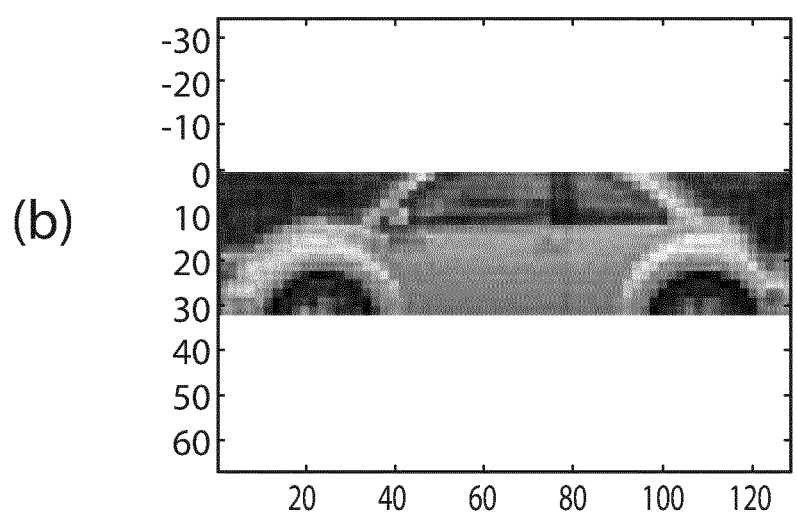
Figure 11:
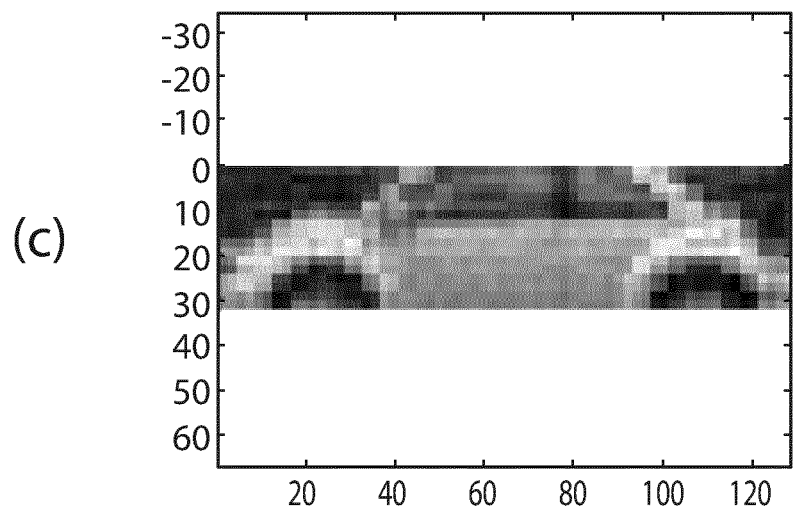

The same CAOS hardware used in FIG. 9 experiment is used to demonstrate time compressive imaging method proposed in FIG. 4 for 2-D irradiance variation targets. Specifically, a 2-D circular target is used that creates optical irradiance variation in both horizontal and vertical directions with the variation that is pixel-wise smooth (Note: Diffraction at boundary edges of spot is graceful and gradual in irradiance change) is shown in FIG. 10(a), where CAOS CDMA imaging is implemented for a 64×64 CAOS pixels grid (64 pixels along vertical direction and 64 pixels along horizontal direction). With MN=64×64=4096 pixels, one requires 4096 time bits Walsh codes. Hence a FIG. 4 W-Matrix is designed using a 4096×4096 H-matrix. FIG. 10(a) shows the zero time compression 2-D image of the CAOS captured near circular spot bright light target, indeed showing the 2-D irradiance variations along both the horizontal and vertical directions of the full square image. Next, time compressed CAOS images of the target are shown in FIG. 10 (b), (c) for time compression factors of 90%, 95%, respectively. In all cases, the near circular bright spot target is successfully imaged. The experiment verifies that the proposed FIG. 4 approach to derive the required modified W-Matrix for time compressive CAOS 2-D irradiance mapping works as in all cases, the 2-D irradiance variation is recovered in the experiment. For ideal non-time compressed case for target recovery, 4096 time bits are used (see FIG. 10a) while for faster time compressed irradiance recovery with 90%, 95%, time compression factors, used are Walsh codes with time bit counts of 409 and 204, respectively. The case of FIG. 10(c) gives a 4096/204=20.1 times faster CAOS CDMA 2-D imaging than the ideal FIG. 10(a) 2-D imaging using the full 4096 time bits Walsh codes. FIG. 11 shows computer simulation test of the proposed FIG. 4 embodiment of time compressive CAOS camera imaging suited for 2-D irradiance variation complex contours target. Image CAOS image grid is 32×128=4096 CAOS pixels. The modified W-matrix generated using the proposed FIG. 4 method is a 4096×4096 matrix that is used to simulate time compressive CAOS-based high speed 2-D imaging. Time compressed CAOS 2-D images of the 2-D automobile (Beetle Car) target are shown in (a), (b), (c) for time compression factors of 0%, 75%, 90%, respectively. In all cases, the near Beetle car target is successfully imaged. The FIG. 11(c) CAOS imaging used 409 Walsh code time bits, indicating a 4096/409=10.01 times faster CAOS imaging versus when using the full 4096 time bits code for zero time compression imaging.

To conclude, 2-D time compressive CAOS imaging using the FIG. 4 CDMA code generation method is verified experimentally in hardware and in computer simulation, leading to much faster speed CAOS imaging versus standard zero time compression CAOS CDMA-mode imaging. This speed benefit can be used to use CAOS FM-CDMA mode or any other CAOS mode involving CDMA-mode imaging to generate high linear dynamic range CAOS imaging, a unique feature of CAOS imaging.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a memory stick or hard disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A method for performing optical image detection using a camera module comprising a Digital MicroMirror Device, DMD (DMD1), a first point Photo Detector (PD1), a second point Photo Detector (PD2), a first lens (L3) and a second lens (L2), the method comprising:

mapping incident light onto an image plane of the DMD to form a light irradiance map;

selecting N pixels on the DMD for time-frequency coding;

associating each selected pixel with a unique Walsh code time sequence;

time-frequency coding by the DMD the optical irradiance values of each selected pixel using a plurality of selected bits of its associated Walsh code time sequence;

wherein when a pixel of said selected pixels is being encoded with a code sequence bit the +θ tilt state of a DMD micromirror associated with the pixel images light from the pixel onto the first point Photo Detector (PD1) by means of the first lens (L3) and the −θ tilt state of the DMD micromirror images encoded pixel light onto the second point Photo Detector (PD2) by means of the second lens (L2);

detecting the time-frequency coded optical irradiance values of the selected pixels simultaneously at the first point Photo Detector and at the second point Photo Detector; and performing simultaneous signal processing on the time-frequency coded optical irradiance values detected by the first point Photo Detector and by the second point Photo Detector to determine the light intensity of each of the selected pixels and produce an image of the incident light; wherein the method further comprises:
time-frequency coding by the DMD the optical irradiance values of each selected pixel using the first M bits of its associated N-bit full Walsh code time sequence so as to perform time compression higher speed imaging, where M is a number which satisfies $2^n$, wherein n is an integer and M is smaller than N.

2. The method of claim 1, further comprising adding a calibration bit to the start of the bits of the Walsh code time sequence detected by the first point Photo Detector and by the second point Photo Detector for each selected pixel prior to performing signal processing.

3. The method of claim 1 wherein the camera module further comprises a third lens (L1) positioned in front of the DMD, the method further comprising:

mapping the incident light onto the image plane of the DMD by means of the third lens (L1).

4. The method of claim 3, wherein the first lens (L2), the second lens (L3) and the third lens (L1) comprise an imaging lens and wherein the first point Photo Detector (PD2) is sensitive to a first spectral band and the second point Photo Detector (PD1) is sensitive to a second spectral band such that when the incident light comprises full spectrum light an image of the incident light is produced over two spectral bands.

5. The method of claim 4, wherein the camera module further comprises a first dichroic beam splitter (DBS1), a second dichroic beam splitter (DBS2), a third point Photo Detector (PD3) which is sensitive to a third spectral band and a fourth point Photo Detector (PD4) which is sensitive to a fourth spectral band;

wherein the first dichroic beam splitter (DBS1) is positioned between the first lens (L2) and the first point Photo Detector (PD2) and the second dichroic beam splitter (DBS2) is positioned between the second lens (L3) and the second point Photo Detector (PD1), and wherein the first dichroic beam splitter (DBS1) separates imaged light between the first point Photo Detector (PD2) and the third point Photo Detector (PD3) and the second dichroic beam splitter (DBS2) separates imaged light between the second point Photo Detector (PD1) and the fourth point Photo Detector (PD4);

wherein the method further comprises:

detecting the time-frequency coded optical irradiance values of the selected pixels simultaneously at the first point Photo Detector (PD2), the second point Photo Detector (PD1), the third point Photo Detector (PD3) and the fourth point Photo Detector (PD4);

adding a "0" calibration bit to the start of the bits of the Walsh code bit sequence detected by the third point Photo Detector (PD3) and adding a "1" calibration bit to the start of the bits of the Walsh code bit sequence detected by the fourth point Photo Detector (PD4); and performing simultaneous signal processing on the time frequency coded optical irradiance values detected by the first point Photo Detector, the second point Photo Detector, the third point Photo Detector and the fourth point Photo Detector to determine the light intensity of each of the selected pixels and produce an image of the incident light over four spectral bands.

6. The method of claim 3, wherein the camera module further comprises a dispersive optic (D1) positioned in front of the third lens (L1), such that when the incident light comprises multi-wavelength collimated light, the method further comprises:

spatially dispersing by the dispersive optic (D1) the incident light along one dimension into its spectral components prior to mapping onto the image plane of the DMD by means of the third lens (L1).

7. The method of claim 1, wherein the first lens (L3) and the second lens (L2) comprise an imaging lens, wherein the DMD is a 2-D DMD configured to translate in sub-micromirror distances along the x and y directions and wherein the camera module further comprises a 2-D folded spectrum optical dispersion optic (D3) positioned in front of the DMD, such that when the incident light comprises multi-wavelength collimated light, the method further comprises:

producing by the 2-D folded spectrum optical dispersion optic (D3) a 2-D folded spectrum irradiance distribution in the x-y dimensions from the incident light prior to mapping onto the image plane of the DMD.

8. The method of claim 7, wherein the 2-D folded spectrum optical dispersion optic (D3) is formed by cascading a dispersive optic with a small free spectral range (D2) with a dispersive optic with a large free spectral range (D1) and beamforming optics, such that the x-direction optical irradiance distribution on the DMD imaging plane covers a coarse wavelength total bandwidth range equal to the free spectral range of the dispersive optic with a large free spectral range (D1) and the y-direction optical irradiance distribution on the DMD imaging plane covers a fine wavelength total bandwidth range equal to the free spectral range of the dispersive optic with a small free spectral range (D2).

9. The method of claim 1, wherein the first lens (L3) and the second lens (L2) comprise an imaging lens, wherein the DMD is configured to translate in sub-micromirror distances along the x and y directions and wherein the camera module further comprises a first tiltable mirror (M1) and a second tiltable mirror (M2), a third imaging lens (L1) between the first mirror (M1) and the second mirror (M2), and a Photo-Detector Array (PDA) sensor, the method further comprising configuring the camera such that when the second mirror (M2) is flat, incident light strikes the first mirror (M1) to be imaged onto the image plane of the DMD by means of the third lens (L1), and when the second mirror (M2) is tilted, incident light strikes the first mirror (M1) to be imaged onto the PDA sensor by means of the third lens (L1), wherein the PDA sensor is configured to provide an initial image map of the incident light for smart control of the camera.

10. The method of claim 9 wherein the second tiltable mirror (M2) comprises a Digital Single Lens Reflex mirror and the method further comprising:
configuring the tilt motion of the first mirror (M1) to increase the field of view (FOV) of the camera and to provide 2-D image translation on the DMD plane.

11. The method of claim 1, wherein when the DMD is a 1-D DMD, and wherein the step of selecting N pixels on the DMD for time frequency coding comprises:
assigning each pixel on the DMD a unique number corresponding to their sequential position along the x-axis of the DMD; and
selecting those pixels assigned a number between 1 and N as the N pixels.

12. The method of claim 11, wherein the step of associating each selected pixel with a unique Walsh code time sequence comprises:
generating a N×N Walsh matrix, wherein the rows of the matrix are numbered from top to bottom sequentially from 1 to N and each row represents a unique N-bit Walsh code time sequence;
calculating the sequency parameter S for each column of the N×N Walsh matrix;
generating a sequency ordered modified Walsh matrix by reordering the columns of the Walsh matrix from left to right in increasing order of the calculated sequency parameter S; and
associating each selected pixel with the row of the sequency ordered modified Walsh matrix of the same number as the number assigned to the pixel.

13. The method of claim 1 wherein when the DMD is a 2D DMD, and wherein the step of selecting N pixels on the DMD for time frequency coding comprises:
forming a 2D pixel grid of N=K×J pixels from neighbouring pixels in 2D space on the DMD, the grid corresponding to the selected N pixels; and
assigning each pixel in the grid a unique number between 1 and N; wherein the unique number is assigned to the pixels in the grid sequentially from left to right along each row in turn.

14. The method of claim 13 wherein the step of associating each selected pixel with a unique Walsh code time sequence comprises:
generating a N×N Walsh matrix, wherein each row of the matrix represents a unique N-bit Walsh code time sequence;
folding each column of the Walsh matrix into the same K×J 2D pixel grid;
calculating sequency parameters for each grid;
generating a modified N×N Walsh matrix by reordering the columns of the Walsh matrix from left to right in increasing order of calculated sequency parameters;
numbering the rows of the modified Walsh matrix from top to bottom sequentially from 1 to N; and
associating each selected pixel with the row of the modified Walsh matrix of the same number as the number assigned to the pixel.

15. The method of claim 14, wherein the steps of calculating sequency parameters for each grid and generating a modified Walsh matrix by reordering the columns of the Walsh matrix from left to right in increasing order of calculated sequency parameters comprise:
calculating a sequency number for each row and each column of each grid;
calculating a total sequency number $S(T)=S(x)+S(y)$ for each column of the Walsh matrix by adding the total sum sequency $S(x)$ for all rows to the total sum sequency $S(y)$ for all columns of its associated grid;
calculating $\Delta S$ as the absolute value of $S(x)-S(y)$;
generating a modified Walsh matrix by reordering the columns of the Walsh matrix from left to right in increasing order of calculated S(T) values;
wherein if the calculated S(T) values match for any columns, ordering these columns in increasing order of $\Delta S$ values, and wherein if the calculated $\Delta S$ values match for any columns, ordering these columns in increasing order of sequency S.

* * * * *